(12) United States Patent
Imamura et al.

(10) Patent No.: US 12,528,922 B2
(45) Date of Patent: Jan. 20, 2026

(54) PLATE-SHAPED COMPOSITE MATERIAL

(71) Applicant: NITTO DENKO CORPORATION, Ibaraki (JP)

(72) Inventors: Shunji Imamura, Ibaraki (JP); Shimpei Yakuwa, Ibaraki (JP); Kou Uemura, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 893 days.

(21) Appl. No.: 17/604,102

(22) PCT Filed: Apr. 16, 2020

(86) PCT No.: PCT/JP2020/016678
§ 371 (c)(1),
(2) Date: Oct. 15, 2021

(87) PCT Pub. No.: WO2020/213669
PCT Pub. Date: Oct. 22, 2020

(65) Prior Publication Data
US 2022/0220265 A1   Jul. 14, 2022

(30) Foreign Application Priority Data

Apr. 19, 2019   (JP) ................. 2019-080151

(51) Int. Cl.
*C08J 5/18*    (2006.01)
*C08J 5/00*    (2006.01)
(Continued)

(52) U.S. Cl.
CPC ............... *C08J 5/18* (2013.01); *C08J 5/005* (2013.01); *C08K 3/36* (2013.01); *C08J 2327/18* (2013.01);
(Continued)

(58) Field of Classification Search
CPC . C08J 5/18; C08J 5/005; C08J 2327/18; C08J 2363/00; C08J 9/28; C08J 5/04;
(Continued)

(56) References Cited

U.S. PATENT DOCUMENTS 5,354,611 A     10/1994   Arthur et al.
9,795,541 B2 *  10/2017   Fontein ............... A61K 6/887
(Continued)

FOREIGN PATENT DOCUMENTS

CN     107849284 A    3/2018
CN     108780674 A    11/2018
(Continued)

OTHER PUBLICATIONS

International Search Report dated Jul. 14, 2020, issued in counterpart International Application No. PCT/JP2020/016678 (w/ English translation; 7 pages).
(Continued)

*Primary Examiner* — Robert S Jones, Jr.
*Assistant Examiner* — Zhen Liu
(74) *Attorney, Agent, or Firm* — WHDA, LLP

(57) ABSTRACT

Provided is a plate-shaped composite material which can sufficiently exhibit an interference effect between antenna elements when utilized as, for example, a substrate of a microstrip patch antenna. The interference effect between the antenna elements can be sufficiently exhibited by controlling the composite material so that, when the material is divided into a plurality of regions, a standard deviation of density values of the respective regions is kept at a certain value or less.

8 Claims, 3 Drawing Sheets

(51) Int. Cl.
*C08K 3/36* (2006.01)
*H01Q 9/04* (2006.01)
*H05K 1/03* (2006.01)

(52) U.S. Cl.
CPC ........ *C08J 2363/00* (2013.01); *H01Q 9/0407* (2013.01); *H05K 1/03* (2013.01)

(58) Field of Classification Search
CPC ...... C08K 3/36; H01Q 9/0407; H01Q 1/3233; H01Q 1/38; H01Q 21/065; H01Q 13/08; H05K 1/03; H05K 1/0373; H05K 2201/015; H05K 2201/0209; H05K 2201/029; H05K 2201/10098; H05K 1/0366

See application file for complete search history.

(56) References Cited

U.S. PATENT DOCUMENTS

| | | | |
|---|---|---|---|
| 2011/0227796 A1* | 9/2011 | Kuroda | H01Q 1/38 501/134 |
| 2012/0231323 A1* | 9/2012 | Takagi | B32B 27/32 428/220 |
| 2018/0200985 A1 | 7/2018 | Kasagi et al. | |
| 2019/0074104 A1* | 3/2019 | Kasagi | H01B 3/006 |
| 2020/0024409 A1 | 1/2020 | Takeyama et al. | |
| 2020/0079931 A1 | 3/2020 | Yakuwa et al. | |

FOREIGN PATENT DOCUMENTS

| | | | | |
|---|---|---|---|---|
| JP | H03212987 A | | 9/1991 | |
| JP | H06119810 A | | 4/1994 | |
| JP | 2003151352 A | * | 5/2003 | ............. B82Y 30/00 |
| JP | 2008034724 A | | 2/2008 | |
| JP | 2010167676 A | | 8/2010 | |
| JP | 2014042996 A | | 3/2014 | |
| JP | 2017079320 A | | 4/2017 | |
| JP | 2018070709 A | | 5/2018 | |
| KR | 10-2018-0126473 A | | 11/2018 | |
| WO | 2017018105 A1 | | 2/2017 | |
| WO | 2017159816 A1 | | 9/2017 | |
| WO | 2018/066433 A1 | | 4/2018 | |
| WO | 2018221556 A1 | | 12/2018 | |

OTHER PUBLICATIONS

Office Action dated Feb. 16, 2023, issued in counterpart CN Patent Application No. 202080029472.3, with its English machine translation. (13 pages).
Office Action dated Aug. 8, 2023, issued in counterpart TW application No. 109112796, with English translation. (10 pages).
Office Action dated Sep. 29, 2023, issued in counterpart JP application No. 2021-514207, with English translation. (10 pages).
Office Action dated Sep. 12, 2023, issued in counterpart CN Application No. 202080029472.3, with English translation. (11 pages).
International Preliminary Report on Patentability, dated Oct. 28, 2021, issued in counterpart International Application No. PCT/JP2020/016678 (in English; 7 pages).
Office Action dated Feb. 20, 2024, issued in counterpart JP application No. 2021-514207, with English translation. (8 pages).
Office Action dated Mar. 7, 2024, issued in counterpart TW application No. 109112796, with English translation. (14 pages).
Office Action dated Dec. 11, 2024, issued in counterpart TW application No. 109112796, with English translation. (12 pages).
Office Action dated Feb. 21, 2025, issued in counterpart KR Application No. 10-2021-7033576, with English translation. (10 pages).

* cited by examiner

PLATE-SHAPED COMPOSITE MATERIAL

TECHNICAL FIELD

The present disclosure relates to a plate-shaped composite material suitable for a substrate of a microstrip patch antenna or the like to be used as a millimeter-wave radar or the like.

BACKGROUND ART

In recent years, in the automobile industry, research and development on advanced driver-assistance systems (ADAS) and automatic driving have been actively conducted, and the importance of a millimeter-wave radar as a sensing technology supporting the ADAS and automatic driving has also been growing. As the millimeter-wave radar for automobiles, the use of a "microstrip patch antenna" that is a planar antenna in which an antenna element (patch) or the like is printed and wired on a resin substrate is promising from the viewpoints of a small size, high performance, and low cost. Accordingly, the design of an antenna pattern and a substrate material have been investigated in order to achieve high performance.

As the substrate material to be used for those antennae, polytetrafluoroethylene (PTFE) having a small loss tangent is one of the promising materials. Further, in order to improve mechanical properties, thermal properties, and electrical properties, it has been proposed to blend a granular filler, such as boron nitride, silicon dioxide (silica), or titanium oxide (titania), or a filler such as a glass fiber or a carbon fiber (see PTLs 1 and 2).

RELATED ART DOCUMENTS

Patent Documents

PTL 1: JP-A-HEI03(1991)-212987
PTL 2: JP-A-HEI06(1994)-119810

SUMMARY

The microstrip patch antenna has a feature of obtaining high directivity through use of the interference effect between antenna elements (patches). However, for example, even when an attempt is made to resonate radio waves emitted from the respective antenna elements, deviation occurs in wavelengths between the radio waves, with the result that the effect thereof may not be sufficiently exhibited.

The present disclosure provides a plate-shaped composite material which can sufficiently exhibit an interference effect between antenna elements when utilized as, for example, a substrate of a microstrip patch antenna.

The inventors have made extensive investigations in order to solve the above-mentioned problem, and as a result, have found that the interference effect between antenna elements when the composite material is utilized as, for example, a substrate of a microstrip patch antenna can be sufficiently exhibited by controlling the composite material so that, when the material is divided into a plurality of regions, density values of the respective regions satisfy particular conditions.

Specifically, the present disclosure is as described below.
<1-1> A plate-shaped composite material, including: a resin; and at least one kind selected from the group consisting of a filler and a reinforcing material, wherein, when the plate-shaped composite material is divided into a plurality of regions, a standard deviation of densities (unit: $g/cm^3$) of the respective regions is 0.027 or less, which is calculated from a density value group including the densities.
<1-2> The plate-shaped composite material according to Item <1-1>, wherein a variation value of the densities calculated by substituting a maximum value, a minimum value, and an average value of the density value group into the expression ((maximum value−minimum value)/average value×100) is 7.4% or less.
<1-3> The plate-shaped composite material according to Item <1-1> or <1-2>, wherein the plate-shaped composite material has a porosity of from 3 vol % to 90 vol %.
<1-4> The plate-shaped composite material according to any one of Items <1-1> to <1-3>, wherein the plate-shaped composite material contains the filler, and wherein a content of the filler is from 10 mass % to 90 mass %.
<1-5> The plate-shaped composite material according to any one of Items <1-1> to <1-4>, wherein the plate-shaped composite material contains the filler, wherein a content of the filler is 57 mass % or less, and wherein, when the plate-shaped composite material is divided into a plurality of regions, a standard deviation of contents (unit: mass %) of the filler in the respective regions is 1.0 or less, which is calculated from a content value group including the contents.
<1-6> The plate-shaped composite material according to any one of Items <1-1> to <1-5>, wherein the plate-shaped composite material contains the reinforcing material, and wherein a content of the reinforcing material is from 10 mass % to 90 mass %.
<1-7> The plate-shaped composite material according to any one of Items <1-1> to <1-6>, wherein, when the plate-shaped composite material is divided into a plurality of regions, a standard deviation of specific dielectric constants of the respective regions is 0.02 or less, which is calculated from a specific dielectric constant value group including the specific dielectric constants.
<1-8> A substrate, including the plate-shaped composite material of any one of Items <1-1> to <1-7>.
<1-9> The substrate according to Item <1-8>, wherein the substrate is used for a microstrip patch antenna.

The present disclosure may also be expressed as described below.
<2-1> A use as a substrate of a plate-shaped composite material including: a resin; and at least one kind selected from the group consisting of a filler and a reinforcing material, wherein, when the plate-shaped composite material is divided into a plurality of regions, a standard deviation of densities (unit: $g/cm^3$) of the respective regions is 0.027 or less, which is calculated from a density value group including the densities.
<2-2> A use as the substrate according to Item <2-1>, wherein the substrate is used for a microstrip patch antenna.

According to the present disclosure, the plate-shaped composite material which can sufficiently exhibit an interference effect between antenna elements when utilized as, for example, a substrate of a microstrip patch antenna can be provided.

DESCRIPTION OF EMBODIMENTS

The present disclosure is described by way of specific examples. However, the present disclosure is not limited to the following contents and may be carried out with appropriate modifications without departing the spirit thereof.

<Plate-Shaped Composite Material>

A composite material according to one embodiment of the present disclosure (hereinafter sometimes abbreviated as "composite material") is a plate-shaped composite material, including: a resin; and at least one kind selected from the group consisting of a filler and a reinforcing material, wherein, when the plate-shaped composite material is divided into a plurality of regions, a standard deviation of densities (unit: $g/cm^3$) of the respective regions is 0.027 or less, which is calculated from a density value group including the densities.

Figure 1:
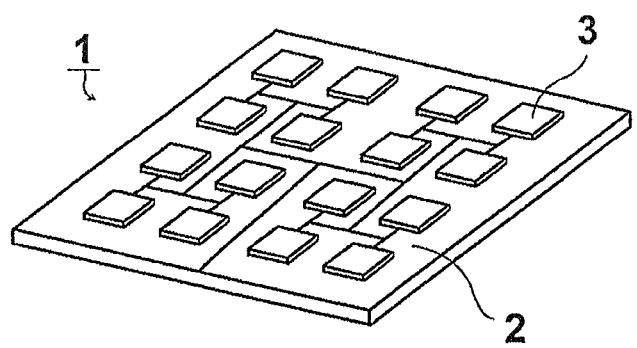
FIG. 1 is a conceptual perspective view for illustrating a specific example of a microstrip patch antenna.
Figure 2:
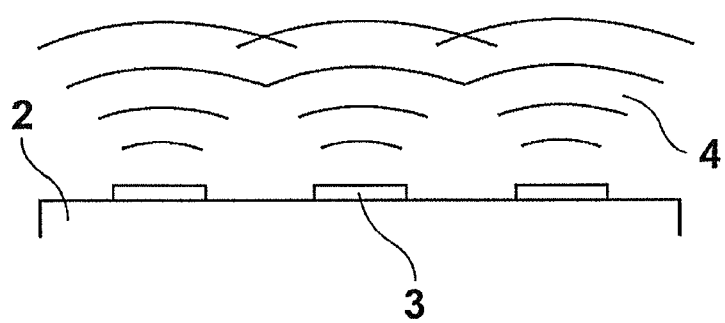
FIG. 2 is a conceptual side view for illustrating the interference effect such as resonance of radio waves emitted from the microstrip patch antenna.

A microstrip patch antenna (sometimes referred to as "microstrip patch array antenna") as illustrated in FIG. 1 can utilize the interference effect between antenna elements (patches) as illustrated in FIG. 2, and hence has a feature of obtaining high directivity. However, for example, in the case where the quality or the like of a substrate is poor, even when an attempt is made to resonate radio waves emitted from the respective antenna elements, deviation occurs in wavelengths between the radio waves, with the result that the effect thereof may not be sufficiently exhibited. The inventors have clarified that the presence of "unevenness" (in particular, unevenness in in-plane distribution of the substrate) in, for example, composition of the substrate is one of the causes for the foregoing, and in particular, this problem significantly appears in a substrate having a filler blended thereinto and a substrate having a reinforcing material introduced thereinto. The blending of the filler has the action to improve the performance of the substrate. However, the filler is a solid, and hence it is difficult to uniformly distribute the filler in the resin serving as a base material, with the result that it is conceived that the "unevenness" is liable to occur in the distribution of the filler itself and pores. The same applies also to the introduction of the reinforcing material, and it is conceived that the "unevenness" is liable to occur in the distribution of the reinforcing material and the pores. In addition, it is conceived that a difference is caused in physical properties, for example, a specific dielectric constant of the substrate, and as a result, deviation occurs in wavelengths between the radio waves emitted from the antenna elements arranged on the substrate. This "unevenness" problem has also been recognized in existing commercially available substrates each having a filler blended thereinto and existing commercially available substrates each having a reinforcing material introduced thereinto (see, for example, Comparative Examples 2 and 3), and in the application to a microstrip patch antenna (hereinafter sometimes abbreviated as "patch antenna"), it is important particularly to create a new composite material that solves this problem. Then, the inventors have focused on "density" that enables the filler, the reinforcing material, the pores, and the like to be comprehensively grasped, and as a result, have found that the interference effect between the antenna elements can be sufficiently exhibited by controlling the composite material so that, when the material is divided into a plurality of regions, a standard deviation of density values of the respective regions is kept at a certain value or less.

Now, the contents of "density", "resin", "filler", "reinforcing material", and the like related to the "composite material" are described in detail.

Figure 3:
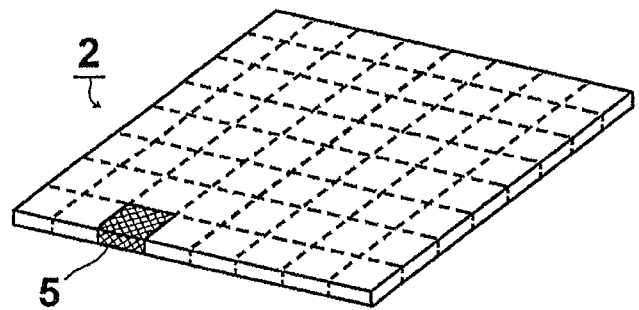
FIG. 3 is a conceptual perspective view for illustrating a substrate divided into a plurality of regions.

The composite material is characterized in that, when the plate-shaped composite material is divided into a plurality of regions, a standard deviation of densities (unit: $g/cm^3$) of the respective regions is 0.027 or less, which is calculated from a density value group including the densities, and the phrase "divided into a plurality of regions" means that the composite material is divided into a plurality of regions actually or in a pseudo manner for the purpose of analysis as illustrated in FIG. 3. A method of dividing the region of the composite material and a method of measuring a density are not particularly limited. In at least on embodiment, the composite material is divided by cutting the composite material into a plurality of test pieces each having predetermined dimensions (generally the dimensions are standardized). The plurality of test pieces are defined as respective regions, and the mass and volume of each of the test pieces are measured. The mass is divided by the volume, and the resultant numerical value is the density of the region. The filler and pores in the composite material are generally very minute with respect to the test piece, and hence the numerical value of the density can be stably obtained. However, when an error is large, measurement is performed under the condition that the dimensions of the test piece are standardized to "10 mm×10 mm" (candidates for longitudinal and lateral dimensions: 2 mm, 5 mm, 10 mm, 20 mm, 30 mm, 40 mm, 50 mm, 100 mm, etc.). The phrase "density value group" refers to a group of density numerical values (density values) and includes the density values corresponding to the number of regions divided for analysis. For example, when the number of the regions is 10, the number of the density values in the group is generally 10. However, it is not required to measure the density for all the divided regions.

The composite material is characterized in that when the composite material is divided into a plurality of regions, a standard deviation of densities (unit: $g/cm^3$) of the respective regions is 0.027 or less, which is calculated from a density value group including the densities, and the phrase "standard deviation of densities" refers to a numerical value calculated by substituting the densities of the respective regions into the following equation. That is, the value of "standard deviation of densities" serves as an indicator for grasping the variation in densities of the respective regions of the composite material.

$$s = \sqrt{\frac{1}{n}\sum_{i=1}^{n}(d_i - \overline{d})^2}$$

s: standard deviation of densities
$d_i$: density of i-th region [g/cm$^3$]
$\overline{d}$ (overline): average value of densities [g/cm$^3$]
n: number of regions The number of the regions of the composite material, which is typically from 2 to 100, is preferably 4 or more, more preferably 8 or more, and is preferably 50 or less, more preferably 30 or less. When the number of the regions falls within the above-mentioned ranges, the standard deviation of the densities can be calculated more accurately.

The standard deviation of the densities of the composite material is 0.027 or less, preferably 0.026 or less, more preferably 0.025 or less, still more preferably 0.024 or less, particularly preferably 0.020 or less, more particularly preferably 0.018 or less, most preferably 0.015 or less, and is typically 0.001 or more. When the standard deviation falls within the above-mentioned ranges, the composite material can exhibit the interference effect between antenna elements more easily when utilized, for example, as a substrate of a patch antenna.

The variation value [numerical value calculated by substituting a maximum value, a minimum value, and an average value of the density value group into the expression ((maximum value-minimum value)/average value×100)] of the densities of the composite material is typically 7.4% or less, preferably 7.0% or less, more preferably 6.8% or less, still more preferably 6.5% or less, particularly preferably 6.0% or less, most preferably 5.0% or less, and is typically 0.1% or more. When the variation value falls within the above-mentioned ranges, the composite material can exhibit the interference effect between antenna elements more easily when utilized, for example, as a substrate of a patch antenna.

When the composite material contains a filler, it is preferred that, when the composite material is divided into a plurality of regions, a standard deviation of contents (unit: mass %) of the filler in the respective regions be 1.0 or less, which is calculated from a content value group. In this context, the phrase "content value group" refers to the set of values corresponding to the filler contents in the plurality of regions of the composite material. The standard deviation of the contents of the filler in the composite material is preferably 0.8 or less, more preferably 0.7 or less, still more preferably 0.6 or less, particularly preferably 0.5 or less, most preferably 0.4 or less, and is typically 0.01 or more. In addition, when the content of the filler is 57 mass % or less, the standard deviation of the contents of the filler in the composite material is preferably 0.9 or less, more preferably 0.8 or less, still more preferably 0.7 or less, particularly preferably 0.6 or less, most preferably 0.55 or less, and is typically 0.01 or more. When the standard deviation falls within the above-mentioned ranges, the composite material can exhibit the interference effect between antenna elements more easily when utilized, for example, as a substrate of a patch antenna.

When the composite material contains a filler, it is preferred that the variation value [numerical value calculated by substituting a maximum value, a minimum value, and an average value of the content value group into the expression ((maximum value-minimum value)/average value×100)] of the contents of the filler be 11.0% or less. The variation value of the contents of the filler in the composite material is preferably 10.0% or less, more preferably 7.5% or less, particularly preferably 5.0% or less, more preferably 2.8% or less, more preferably 2.6% or less, more preferably 2.4% or less, more preferably 2.2% or less, most preferably 2.0% or less, and is typically 0.1% or more. In addition, when the content of the filler is 57 mass % or less, the variation value of the contents of the filler in the composite material is preferably 11.0% or less, more preferably 10.0% or less, still more preferably 7.5% or less, particularly preferably 5.0% or less, most preferably 2.5% or less, and is typically 0.1% or more. When the variation value falls within the above-mentioned ranges, the composite material can exhibit the interference effect between antenna elements more easily when utilized, for example, as a substrate of a patch antenna.

When the composite material contains a reinforcing material, it is preferred that, when the composite material is divided into a plurality of regions, a standard deviation of contents (unit: mass %) of the reinforcing material in the respective regions be 0.60 or less, which is calculated from a content value group. In this context, the phrase "content value group" refers to the set of values corresponding to the reinforcing material contents in the plurality of regions of the composite material. The standard deviation of the contents of the reinforcing material in the composite material is preferably 0.58 or less, more preferably 0.56 or less, still more preferably 0.54 or less, particularly preferably 0.52 or less, most preferably 0.50 or less, and is typically 0.01 or more. When the standard deviation falls within the above-mentioned ranges, the composite material can exhibit the interference effect between antenna elements more easily when utilized, for example, as a substrate of a patch antenna.

When the composite material contains a reinforcing material, it is preferred that the variation value [numerical value calculated by substituting a maximum value, a minimum value, and an average value of the content value group into the expression ((maximum value-minimum value)/average value×100)] of the contents of the reinforcing material be 3.0% or less. The variation value of the contents of the reinforcing material in the composite material is preferably 2.8% or less, more preferably 2.6% or less, still more preferably 2.4 or less, particularly preferably 2.2% or less, most preferably 2.0% or less, and is typically 1.4% or more. When the variation value falls within the above-mentioned ranges, the composite material can exhibit the interference effect between antenna elements more easily when utilized, for example, as a substrate of a patch antenna.

The specific dielectric constant (frequency: 10 GHz) of the composite material is typically 3.50 or less, preferably 3.00 or less, more preferably 2.50 or less, still more preferably 2.25 or less, particularly preferably 2.00 or less, and is typically 1.50 or more. The specific dielectric constant of the composite material is a numerical value of a real part ($\varepsilon r'$) calculated by measuring a complex dielectric constant in accordance with a cavity resonator perturbation method (measurement frequency: 10 GHz).

It is preferred that, when the composite material is divided into a plurality of regions, a standard deviation of specific dielectric constants of the respective regions be 0.025 or less, which is calculated from a specific dielectric constant value group. In this context, the phrase "specific dielectric constant value group" refers to the set of values corresponding to the specific dielectric constants of the plurality of regions of the composite material. The standard deviation of the specific dielectric constants of the composite material is preferably 0.02 or less, more preferably 0.015 or less, still more preferably 0.012 or less, particularly preferably 0.01 or less, most preferably 0.008 or less, and is typically 0.001 or more. When the standard deviation falls within the above-mentioned ranges, the composite material can exhibit the interference effect between antenna elements more easily when utilized, for example, as a substrate of a patch antenna.

It is preferred that the variation value [numerical value calculated by substituting a maximum value, a minimum value, and an average value of the specific dielectric constant value group into the expression ((maximum value−minimum value)/average value×100)] of the specific dielectric constants of the composite material be 5.0% or less. The variation value of the specific dielectric constants of the composite material is preferably 3.0% or less, more preferably 2.5% or less, still more preferably 2.0% or less, particularly preferably 1.5% or less, most preferably 1.3% or less, and is typically 0.1% or more. When the variation value falls within the above-mentioned ranges, the composite material can exhibit the interference effect between antenna elements more easily when utilized, for example, as a substrate of a patch antenna.

The composite material has a plate shape, and the thickness thereof, which is typically from 2.0 μm to 3,000 μm, is preferably 10 μm or more, more preferably 50 μm or more, still more preferably 80 μm or more, most preferably 100 μm or more, and is preferably 2,000 μm or less, more preferably 1,000 μm or less, still more preferably 800 μm or less, particularly preferably 600 μm or less, most preferably 400 μm or less. When the thickness falls within the above-mentioned ranges, a satisfactory specific dielectric constant and the like as a composite material can be secured.

It is preferred that, when the composite material is divided into a plurality of regions, a standard deviation of thicknesses (unit: μm) of the respective regions be 24 or less, which is calculated from a thickness value group. In this context, the phrase "thickness value group" refers to the set of values corresponding to the thicknesses of the plurality of regions of the composite material. The standard deviation of the thicknesses of the composite material is preferably 20 or less, more preferably 15 or less, still more preferably 10 or less, particularly preferably 5 or less, most preferably 3 or less, and is typically 0.1 or more. When the standard deviation falls within the above-mentioned ranges, the composite material can exhibit the interference effect between antenna elements more easily when utilized, for example, as a substrate of a patch antenna.

It is preferred that the variation value [numerical value calculated by substituting a maximum value, a minimum value, and an average value of the thickness value group into the expression ((maximum value−minimum value)/average value×100)] of the thicknesses of the composite material be 20% or less. The variation value of the thicknesses in the composite material is preferably 18% or less, more preferably 15% or less, still more preferably 10% or less, particularly preferably 8% or less, most preferably 6% or less, and is typically 0.1% or more. When the variation value falls within the above-mentioned ranges, the composite material can exhibit the interference effect between antenna elements more easily when utilized, for example, as a substrate of a patch antenna.

The porosity of the composite material (entire composite material), which is typically from 3 vol % to 90 vol %, is preferably 20 vol % or more, more preferably 30 vol % or more, still more preferably 40 vol % or more, particularly preferably 50 vol % or more, and is preferably 80 vol % or less, more preferably 70 vol % or less, still more preferably 60 vol % or less. When the porosity falls within the above-mentioned ranges, satisfactory properties, such as a specific dielectric constant and a thermal expansion coefficient, as a composite material, can be secured. The porosity of the composite material is a numerical value calculated by measuring the density and mass (blending mass) of the resin and the density and mass (blending mass) of the filler, and substituting the true density of the composite material calculated from the measurement results, the bulk density of the composite material, and the density of air into the following equation.

Porosity [vol %]=(bulk density [g/cm³]−true density [g/cm³])/(bulk density [g/cm³]−density of air [g/cm³])×100

True density [g/cm³]=mass % of filler×density of filler [g/cm³]+mass % of resin×density of resin [g/cm³]

The loss tangent (frequency: 10 GHz) of the composite material is typically 0.01 or less, preferably 0.008 or less, more preferably 0.006 or less, still more preferably 0.004 or less, particularly preferably 0.002 or less, and is typically 0.0005 or more. The loss tangent of the composite material is a ratio ($\varepsilon r''/\varepsilon r'$) of an imaginary part ($\varepsilon r''$) to the real part ($\varepsilon r'$) calculated by measuring a complex dielectric constant in accordance with the cavity resonator perturbation method (measurement frequency: 10 GHz).

The thermal expansion coefficient (Z-axis direction) of the composite material is typically 100 ppm/K or less, preferably 90 ppm/K or less, more preferably 80 ppm/K or less, still more preferably 70 ppm/K or less, particularly preferably 60 ppm/K or less, most preferably 50 ppm/K or less, and is typically 5 ppm/K or more. The thermal expansion coefficient (Z-axis direction) of the composite material is a numerical value calculated from an expression based on JIS R3251-1990 of Japan Industrial Standards through use of a laser interference method (laser thermal dilatometer, measurement temperature range: −50° C. to 200° C., rate of temperature increase: 2° C./min, atmosphere: He, applied load: 17 g).

The dimensions (maximum diameter, and longitudinal or lateral length) of the composite material, which are typically from 20 mm to 1,500 mm, are preferably 30 mm or more, more preferably 40 mm or more, still more preferably 50 mm or more, most preferably 60 mm or more, and are preferably 1,400 mm or less, more preferably 1,300 mm or less.

(Resin)

The kind of the resin is not particularly limited, and a resin used for a substrate or the like may be appropriately adopted. Examples of the resin include thermoplastic resins, such as a fluororesin, and thermosetting resins, such as an epoxy resin, a polyimide resin, and a phenol resin. Of those, a fluororesin, an epoxy resin, and a polyimide resin are preferred, and a fluororesin is particularly preferred. When any of those resins is adopted, "unevenness" is less liable to occur in the distribution of the filler, reinforcing material, and pores, and the features of the present disclosure can be effectively utilized. In addition, the fluororesin exhibits excellent properties as a substrate for millimeter-wave radar. The "fluororesin" means a polymer compound obtained through polymerization of an olefin containing a fluorine atom.

Examples of the fluororesin include polytetrafluoroethylene (PTFE), a perfluoroalkoxyalkane (PFA), a tetrafluoroethylene-hexafluoropropylene copolymer (FEP), polychlorotrifluoroethylene (PCTEF), a tetrafluoroethylene-ethylene copolymer (ETFE), a chlorotrifluoroethylene-ethylene copolymer (ECTFE), and polyvinylidene fluoride (PVDF).

Of those, PTFE is particularly preferred. Those resins may be used alone or in combination thereof.

Examples of the epoxy resin include: a bisphenol-type epoxy resin, such as a bisphenol A-type epoxy resin, a bisphenol F-type epoxy resin, a bisphenol S-type epoxy resin, a bisphenol E-type epoxy resin, a bisphenol M-type epoxy resin, a bisphenol P-type epoxy resin, or a bisphenol Z-type epoxy resin; a novolac-type epoxy resin, such as a phenol novolac-type epoxy resin or a cresol novolac-type epoxy resin; and an epoxy resin, such as a biphenyl-type epoxy resin, a biphenyl aralkyl-type epoxy resin, an aryl alkylene-type epoxy resin, a naphthalene-type epoxy resin, an anthracene-type epoxy resin, a phenoxy-type epoxy resin, a dicyclopentadiene-type epoxy resin, a norbornene-type epoxy resin, an adamantane-type epoxy resin, or a fluorene-type epoxy resin.

Examples of the phenol resin include: a novolac-type phenol resin, such as a phenol novolac resin, a cresol novolac resin, a bisphenol A novolac resin, or a triazine skeleton-containing phenol novolac resin; and a resol-type phenol resin, such as an unmodified resol phenol resin or an oil-modified resol phenol resin.

The polyimide resin may be obtained by causing an organic tetracarboxylic dianhydride and a diamino compound (diamine) to react with each other to synthesize a polyimide precursor (polyamide acid), and subjecting the polyimide precursor to a dehydration and ring closure reaction. Examples of the organic tetracarboxylic dianhydride include pyromellitic dianhydride, 3,3',4,4'-biphenyltetracarboxylic dianhydride, 2,2-bis(2,3-dicarboxyphenyl)-1,1,1,3,3,3-hexafluoropropane dianhydride, 2,2-bis(3,4-dicarboxyphenyl)-1,1,1,3,3,3-hexafluoropropane dianhydride, 3,3',4,4'-benzophenonetetracarboxylic dianhydride, bis(3,4-dicarboxyphenyl) ether dianhydride, and bis(3,4-dicarboxyphenyl) sulfonic dianhydride. Those organic tetracarboxylic dianhydrides may be used alone or as a mixture thereof. Examples of the diamino compound include m-phenylenediamine, p-phenylenediamine,3,4-diaminodiphenylether, 4,4'-diaminophenyl ether, 4,4'-diaminodiphenyl sulfone, 3,3'-diaminodiphenyl sulfone, 2,2-bis(4-aminophenoxyphenyl)propane, 2,2-bis(4-aminophenoxyphenyl)hexafluoropropane, 1,3-bis(4-aminophenoxy)benzene, 1,4-bis(4-aminophenoxy)benzene, 2,4-diaminotoluene, 2,6-diaminotoluene, diaminodiphenyl-methane, 4,4'-diamino-2,2-dimethylbiphenyl, and 2,2-bis(trifluoromethyl)-4,4'-diaminobiphenyl. Those diamino compounds may be used alone or as a mixture thereof.

When the resin is a fluororesin, the fluororesin is preferably "fibrillated". Fibrils in the fibrillated fluororesin may be oriented in one direction or a plurality of directions, and are more preferably oriented in a plurality of directions, and the fibrils and inorganic fine particle aggregates to be described later are particularly preferably linked to each other to form a "three-dimensional fine network structure." When the fluororesin is fibrillated, in particular, forms the three-dimensional fine network structure, the composite material can secure an excellent mechanical strength and excellent dimensional stability. The fibrillation or the like of the fluororesin may be recognized through the observation of its surface with a SEM or the like. In addition, the fibrillation of the fluororesin, which may be advanced by, for example, applying a shear force, is more specifically performed through multi-stage rolling to be described later. Further, the formation of the three-dimensional fine network structure is performed through, for example, directionally different multi-stage rolling to be described later.

When the resin is a thermosetting resin, a curing accelerator is generally blended. As the "curing accelerator", there are given a thermosetting type that accelerates curing with heat and an activation energy ray curing type that causes curing with an activation energy ray such as a UV-ray.

Examples of the thermosetting type curing accelerator include a phenol compound, an acid anhydride compound, an amide compound, a hydrazide compound, an imidazoline compound, a urea compound, and a polysulfide compound. Of those, a phenol compound is preferred. Those curing agents may be used alone or in combination thereof.

Examples of the active energy ray curing type curing accelerator include a benzoin ether-based photopolymerization initiator, an acetophenone-based photopolymerization initiator, an α-ketol-based photopolymerization initiator, a photoactive oxime-based photopolymerization initiator, a benzoin-based photopolymerization initiator, a benzil-based photopolymerization initiator, a benzophenone-based photopolymerization initiator, a ketal-based photopolymerization initiator, a thioxanthone-based photopolymerization initiator, and an acylphosphine oxide-based photopolymerization initiator.

The content of the curing accelerator, which is typically from 0.1 parts by mass to 10 parts by mass with respect to 100 parts by mass of the total of the thermosetting resin, is preferably 0.2 parts by mass or more, preferably 0.3 parts by mass or more, more preferably 0.4 parts by mass or more, still more preferably 0.5 parts by mass or more, particularly preferably 0.6 parts by mass or more with respect thereto, and is typically 9 parts by mass or less, preferably 8 parts by mass or less, more preferably 7 parts by mass or less, still more preferably 6 parts by mass or less, particularly preferably 5 parts by mass or less with respect thereto.

(Filler)

The kind of the filler is not particularly limited, but examples of the filler include a granular filler and a fibrous filler. Examples of the granular filler include: solid carbon, such as carbon black or graphite; silicon dioxide (silica), such as porous silica, molten silica, or silica gel; an oxide (including a composite oxide) of a transition metal, such as titanium oxide (e.g., titanium dioxide (titania)), iron oxide, or zirconium oxide (e.g., zirconium dioxide (zirconia)); and a nitride of a typical element, such as boron nitride or silicon nitride. Examples of the fibrous filler include a glass fiber and a carbon fiber. In addition, the examples also include hollow inorganic particles, such as silica balloon or glass balloon. Those fillers may be used alone or in combination thereof. Of those, a granular filler is preferred.

When the total of the resin and the filler (total including also the reinforcing material when the reinforcing material is contained) is 100 parts by mass, the loading amount of the filler in the composite material, which is typically from 10 parts by mass to 90 parts by mass, is preferably 20 parts by mass or more, preferably 30 parts by mass or more, more preferably 40 parts by mass or more, still more preferably 45 parts by mass or more, particularly preferably 50 parts by mass or more, and is typically 85 parts by mass or less, preferably 80 parts by mass or less, more preferably 75 parts by mass or less, still more preferably 70 parts by mass or less, particularly preferably 65 parts by mass or less. The content (actual measurement value) of the filler in the composite material, which is typically from 10 mass % to 90 mass %, is preferably 20 mass % or more, preferably 30 mass % or more, more preferably 40 mass % or more, still more preferably 45 mass % or more, particularly preferably 50 mass % or more, and is typically 85 mass % or less, preferably 80 mass % or less, more preferably 75 mass % or less, still more preferably 70 mass % or less, particularly preferably 65 mass % or less. When the composite material is divided into a plurality of regions, the contents of the filler in the respective regions generally vary, and hence the "content of the filler" means an average value. When the content falls within the above-mentioned ranges, satisfactory properties, such as a specific dielectric constant and a thermal expansion coefficient, as a composite material can be exhibited.

Figure 4:
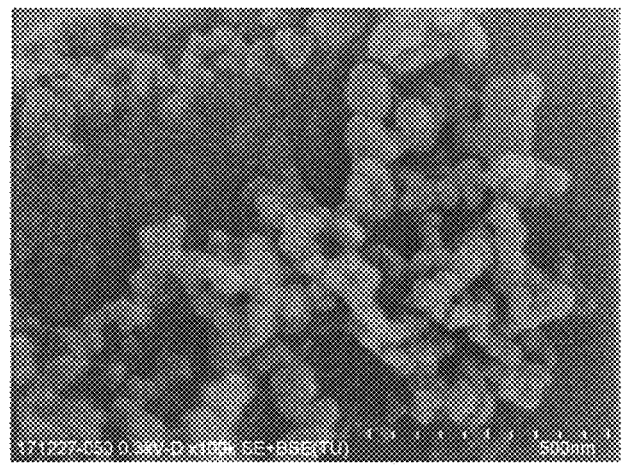
FIG. 4 is an image of a porous inorganic fine particle aggregate formed by aggregation of inorganic fine particles having an average primary particle diameter of from 5 nm to 200 nm taken with a scanning electron microscope (SEM) (photograph serving as an alternative to a drawing).

It is preferred that the composite material contain, as the filler, porous inorganic fine particle aggregates (hereinafter sometimes abbreviated as "inorganic fine particle aggregates") formed by aggregation of inorganic fine particles having an average primary particle diameter of from 5 nm to 200 nm, and non-porous inorganic fine particles. Each of the inorganic fine particle aggregates is specifically such an aggregate as shown in an image taken with a SEM shown in FIG. 4, and means an aggregate that is formed by the fusion of a plurality of inorganic fine particles, and that has voids between the inorganic fine particles and is hence porous. The inorganic fine particles in the aggregate may be fused at the time of formulation, and the fusion may be released by subsequent mixing with a fluororesin or the like. Meanwhile, the "non-porous" of the non-porous inorganic fine particles is an expression with respect to "porous" that is characteristic of the inorganic fine particles, and the non-porous inorganic fine particles may be any inorganic fine particles that are not "porous". That is, it is not required that the non-porous inorganic fine particles have no pores, and may have pores as long as the non-porous inorganic fine particles are not recognized to be "porous".

Now, the "inorganic fine particle aggregates" and the "non-porous inorganic fine particles" are described in detail.

Examples of a material for the inorganic fine particles in the inorganic fine particle aggregates include: an oxide (including a composite oxide) of a typical element, such as silicon oxide (e.g., silicon monoxide or silicon dioxide (silica)) or aluminum oxide (alumina); an oxide (including a composite oxide) of a transition metal, such as titanium oxide (e.g., titanium dioxide (titania)), iron oxide, or zirconium oxide (e.g., zirconium dioxide (zirconia)); and a nitride of a typical element, such as boron nitride or silicon nitride. Those materials may be used alone or in combination thereof. Of those, an oxide of a typical element is preferred, and silicon dioxide (silica) is particularly preferred. The oxide of a typical element can suppress the specific dielectric constant of the composite material to an extremely low level, and enables the production of the composite material at lower cost. Although the crystallinity of the inorganic fine particles is not particularly limited, when silicon dioxide is used, the inorganic fine particles are typically amorphous.

The average primary particle diameter of the inorganic fine particle aggregates, which is from 5 nm to 200 nm, is preferably 10 nm or more, more preferably 15 nm or more, still more preferably 20 nm or more, and is preferably 150 nm or less, more preferably 120 nm or less, still more preferably 100 nm or less, particularly preferably 80 nm or less, most preferably 70 nm or less. In the case where the average primary particle diameter falls within the above-mentioned ranges, the inorganic fine particle aggregates are hardly broken even when subjected to treatment such as mixing, forming, or rolling, and hence satisfactory voids can be secured between the inorganic fine particles. In addition, the plate-shaped composite material can easily secure a smooth surface. The average primary particle diameter of the inorganic fine particle aggregates is a numerical value obtained by: measuring particle diameters through observation with a SEM; and averaging the measured values. The average primary particle diameter is specifically a numerical value obtained as follows: the inorganic fine particle aggregates (100 aggregates) are randomly selected, and their respective average primary particle diameters (the lengths of the long sides of particles) are measured, followed by the averaging of the obtained particle diameters.

The BET specific surface area of the inorganic fine particle aggregates is typically 0.1 $m^2/g$ or more, preferably 0.5 $m^2/g$ or more, more preferably 1 $m^2/g$ or more, still more preferably 5 $m^2/g$ or more, and is typically 250 $m^2/g$ or less, preferably 240 $m^2/g$ or less, more preferably 210 $m^2/g$ or less, still more preferably 150 $m^2/g$ or less, particularly preferably 80 $m^2/g$ or less. When the BET specific surface area falls within the above-mentioned ranges, the composite material can secure a high porosity, and an increase in loss tangent thereof can be suppressed. In particular, when the BET specific surface area is excessively high, the loss tangent of the composite material tends to increase. The BET specific surface area of the inorganic fine particle aggregates is a numerical value calculated by substituting, for example, a gas adsorption amount measured by a gas adsorption method (in particular, a nitrogen adsorption isotherm) into a BET equation, and is represented by a numerical value before the use of the aggregates in the production of the composite material.

The apparent specific gravity of the inorganic fine particle aggregates is typically 10 g/L or more, preferably 20 g/L or more, more preferably 30 g/L or more, still more preferably 40 g/L or more, and is typically 100 g/L or less, preferably 90 g/L or less, more preferably 80 g/L or less, still more preferably 70 g/L or less, particularly preferably 60 g/L or less. When the apparent specific gravity falls within the above-mentioned ranges, the composite material can secure a high porosity, and the inorganic fine particle aggregates are hardly broken. The apparent specific gravity of the inorganic fine particle aggregates is a numerical value obtained by: loading the inorganic fine particle aggregates into a container that can measure a volume, such as a 250-milliliter measuring cylinder; measuring the loaded mass (X g) and loaded volume (Y mL) of the inorganic fine particle aggregates; and dividing the loaded mass by the loaded volume ([apparent specific gravity (g/L)]=X/Y×1,000").

As the inorganic fine particle aggregates, commercially available products, such as MIZUKASIL series (manufactured by Mizusawa Industrial Chemicals, Ltd.), SILYSIA series (manufactured by Fuji Silysia Chemical Ltd.), hydrophobic AEROSIL series (manufactured by Nippon Aerosil Co., Ltd.), and Nipsil series (manufactured by Tosoh Silica Corporation), may be suitably used. Of those, hydrophobic fumed silica of hydrophobic AEROSIL series (manufactured by Nippon Aerosil Co., Ltd.) is particularly preferred.

Examples of a material for the non-porous inorganic fine particles generally include: an oxide (including a composite oxide) of a typical element, such as silicon oxide (e.g., silicon monoxide or silicon dioxide (silica)) or aluminum oxide (alumina); an oxide (including a composite oxide) of a transition metal, such as titanium oxide (e.g., titanium dioxide (titania)), iron oxide, or zirconium oxide (e.g., zirconium dioxide (zirconia)); and a nitride of a typical element, such as boron nitride or silicon nitride. Examples of the composite oxide include cordierite, talc, wollastonite, mullite, steatite, and forsterite. Those materials for the non-porous inorganic fine particles may be used alone or in combination thereof.

The average primary particle diameter of the non-porous inorganic fine particles, which is from 0.2 µm to 50 µm, is preferably 0.3 µm or more, more preferably 0.4 µm or more, still more preferably 0.5 µm or more, and is preferably 40 µm or less, more preferably 30 µm or less, still more preferably 20 µm or less, particularly preferably 10 µm or less, most preferably 5 µm or less. When the average primary particle diameter falls within the above-mentioned ranges, an appropriate specific surface area can be obtained to secure a satisfactory loss tangent. In addition, the surface of the composite material can be easily made smooth, and hence the material becomes more suitable for a substrate for a high frequency. The average primary particle diameter of the non-porous inorganic fine particles is a numerical value obtained by measuring the particle diameters by observation with a SEM and averaging the measured values. Specifically, a procedure involves randomly selecting inorganic fine particle aggregates (100 aggregates), measuring the respective average primary particle diameters thereof (major diameters of the particles), and averaging the obtained particle diameters to obtain a numerical value.

The BET specific surface area of the non-porous inorganic fine particles is typically 0.1 $m^2/g$ or more, preferably 0.5 $m^2/g$ or more, more preferably 1 $m^2/g$ or more, still more preferably 2 $m^2/g$ or more, and is typically 30 $m^2/g$ or less, preferably 25 $m^2/g$ or less, more preferably 20 $m^2/g$ or less, still more preferably 15 $m^2/g$ or less, particularly preferably 10 $m^2/g$ or less. When the BET specific surface area falls within the above-mentioned ranges, a satisfactory loss tangent can be secured. In addition, the surface of the composite material can be easily made smooth, and hence the material becomes more suitable for a substrate for a high frequency. The BET specific surface area of the non-porous inorganic fine particles is a numerical value calculated by substituting, for example, a gas adsorption amount measured by a gas adsorption method (in particular, a nitrogen adsorption isotherm) into a BET equation, and is represented by a numerical value before the use of the particles in the production of the composite material.

The dielectric constant of the non-porous inorganic fine particles is typically 10 or less, preferably 8 or less, more preferably 7 or less, still more preferably 6 or less, particularly preferably 5 or less, and is typically 3 or more. The dielectric constant of the non-porous inorganic fine particles is a numerical value determined by a method based on JIS C2565 of Japanese Industrial Standards.

Examples of a commercially available product of the non-porous inorganic fine particles include: molten silica, such as SFP-130MC, SFP-30M, or FB-3SDC manufactured by Denka Company; cordierite, such as cordierite powder FINE type, ELP-150N, or ELP-325N manufactured by AGC Ceramics Co., Ltd.; boron nitride, such as FS-1 series, HP-P1 series, or HP40J series manufactured by Mizushima Ferroalloy Co., Ltd.; and talc, such as NANO ACE D-600, D-800, D-1000, or FG-1 manufactured by Nippon Talc Co., Ltd.

The mass ratio of the content of the non-porous inorganic fine particles to the total content of the inorganic fine particle aggregates and the non-porous inorganic fine particles (content of non-porous inorganic fine particles/(content of inorganic fine particle aggregates+content of non-porous inorganic fine particles), which is typically from 0.15 to 0.90, is preferably 0.2 or more, more preferably 0.3 or more, still more preferably 0.4 or more, most preferably 0.5 or more, and is preferably 0.8 or less, more preferably 0.75 or less, still more preferably 0.7 or less, most preferably 0.65 or less.

Although the composite material may contain a substance other than the resin and filler described in the foregoing, the total content of the resin and the filler in the composite material is typically 60 mass % or more, preferably 70 mass % or more, more preferably 80 mass % or more, still more preferably 90 mass % or more, particularly preferably 100 mass %.

It is preferred that the surface of the filler (including the inorganic fine particle aggregates and the non-porous inorganic fine particles) be modified with a surface modifier having a hydrophobic group (hereinafter sometimes abbreviated as "surface modifier") for the viewpoint of the loss tangent. However, when the filler is filled into the thermosetting resin, a surface modifier having a functional group other than the hydrophobic group may also be selected in order to prevent the aggregation of the filler.

Now, the modification with the "surface modifier" is described in detail.

Examples of the hydrophobic group of the surface modifier include a fluoro group (—F) and a hydrocarbon group (—$C_nH_{2n+1}$ (n=1 to 30)). Of those, a fluoro group that exhibits a liquid-repelling property not only on water but also on an oil agent is particularly preferred.

The surface modifier may be a surface modifier that chemically adsorbs (reacts) to the surface of the filler, or may be a surface modifier that physically adsorbs to the surface of the filler, and may be a low-molecular weight compound, or may be a polymer compound. The surface modifier that chemically adsorbs (reacts) to the surface of the filler typically has a reactive functional group that reacts with a surface functional group (e.g., a hydroxyl group (—OH)) of the filler, and examples of the reactive functional group include an alkoxysilyl group (—SiOR, where the number of carbon atoms of R is from 1 to 6), a chlorosilyl group (—SiCl), a bromosilyl group (—SiBr), and a hydrosilyl group (—SiH). A known method may be appropriately adopted as a method of modifying the surface of the filler with the surface modifier, and is, for example, a method involving bringing the filler and the surface modifier into contact with each other.

The surface modifiers may be used alone or in combination thereof. For example, after a surface modifier that is a low-molecular weight compound having a reactive functional group has been caused to react with the surface of the filler, a surface modifier that is a polymer compound having a hydrophobic group may be caused to physically adsorb onto the resultant. In the case where a material for the filler is silicon dioxide (silica) or the like, the filler may be dissolved (decomposed) when exposed to a basic aqueous solution. However, when the filler is modified as described above, its resistance to the basic aqueous solution can be improved.

The thermal decomposition temperature of the surface modifier is typically 250° C. or more, preferably 300° C. or more, more preferably 350° C. or more, still more preferably 360° C. or more, particularly preferably 370° C. or more. In the case where the thermal decomposition temperature falls within the above-mentioned ranges, the surface modifier can be suppressed from decomposing even when subjected to treatment such as high-temperature heating. The thermal decomposition temperature of the surface modifier is defined as the temperature at which the weight of the surface modifier reduces by 5% when its temperature is increased by a thermogravimetry-differential thermal analysis method (TG-DTA) at 20° C./min.

Examples of a surface modifier that is a low-molecular weight compound having a fluoro group and a reactive functional group include compounds represented by the following formulae. The compounds represented by the following formulae are commercially available, and may each be appropriately obtained and utilized as a surface modifier.

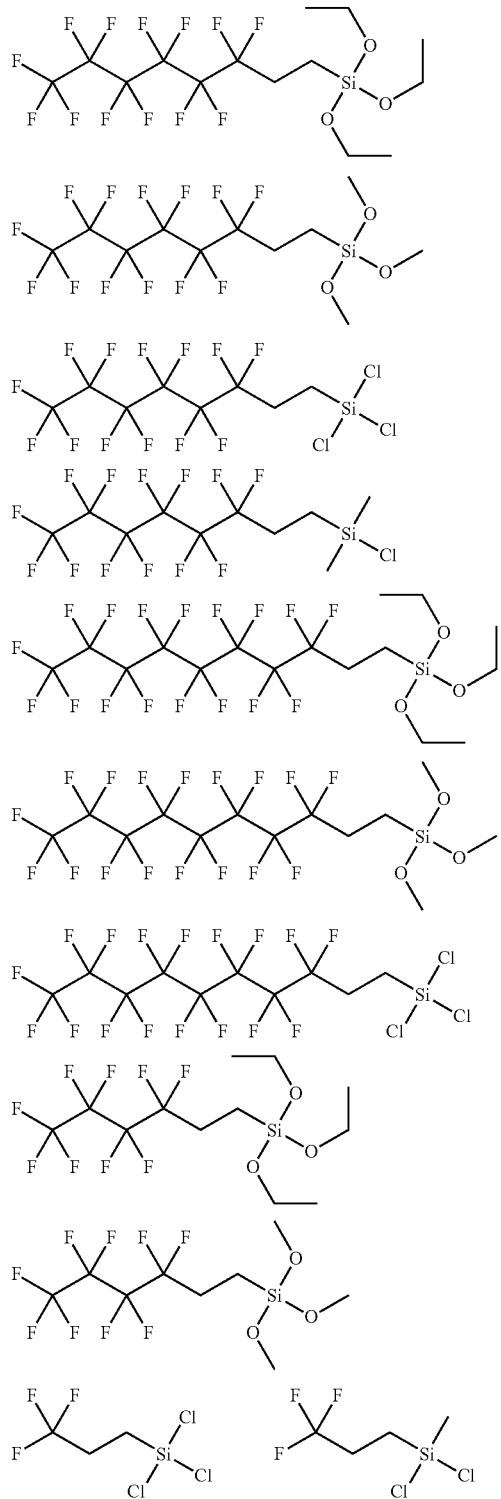

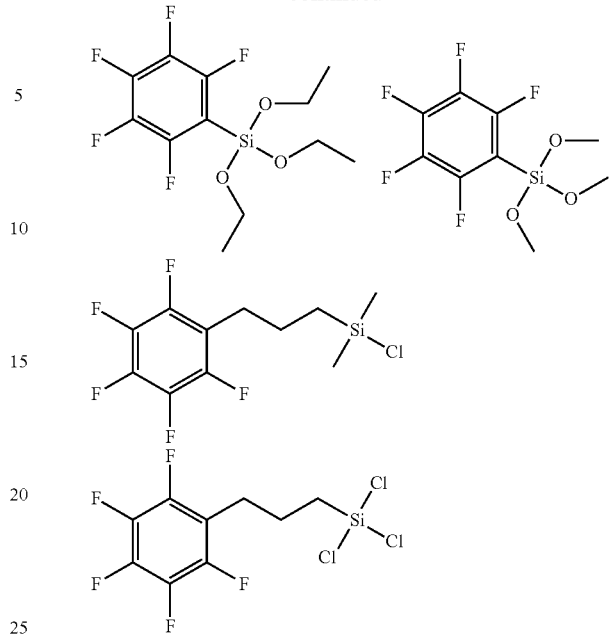

Examples of a surface modifier that is a polymer compound having a fluoro group include compounds represented by the following formulae.

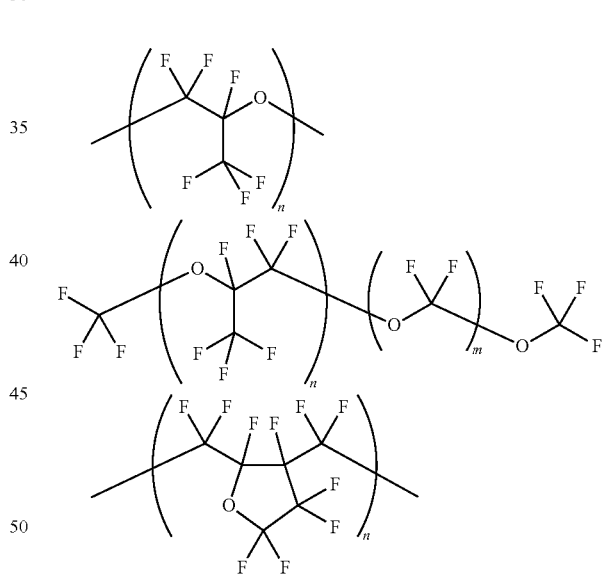

[In the formulae, "n" and "m" each represent a positive number.]

A solution commercially available as a surface modifier may be utilized, and a suitable example thereof is NOVEC (trademark) 2202 manufactured by 3M Company. It has been announced that the NOVEC (trademark) 2202 contains a polymer compound having a fluoro group and is blended with a "fluoroalkylsilane polymer". The use of the NOVEC (trademark) 2202 as a surface modifier has an advantage in that the critical liquid-repellent tension of the composite material is easily suppressed to a low level by a relatively simple operation.

As the functional group other than the hydrophobic group of the surface modifier, there are given a glycidyl group (—C$_2$H$_3$O), a hydroxy group (—OH), an amino group (—NH$_2$), a carboxy group (—COOH), a mercapto group (—SH), and the like, but a functional group that forms a bond with a functional group in the resin or a functional group having a polarity close to that of the functional group in the resin is generally selected. A commercially available product thereof is, for example, a silane coupling agent, and examples thereof include N-2-(aminoethyl)-3-aminopropylmethyldimethoxysilane, N-2-(aminoethyl)-3-aminopropyltrimethoxysilane, 3-triethoxysilyl-N-(1,3-dimethyl-butylidene)propylamine, 2-(3,4-epoxycyclohexyl)ethyltrimethoxysilane, 3-glycidoxypropylmethyldimethoxysilane, and 3-mercaptopropylmethyldimethoxysilane.

The content of the surface modifier (organic matter content) in the filler is typically 0.1 mass % or more, preferably 1 mass % or more, more preferably 2 mass % or more, still more preferably 3 mass % or more, particularly preferably 4 mass % or more, and is typically 50 mass % or less, preferably 40 mass % or less, more preferably 30 mass % or less, still more preferably 25 mass % or less, particularly preferably 20 mass % or less.

(Reinforcing Material)

The reinforcing material means a plate-shaped material having a function to reinforce the mechanical properties of the composite material. When the composite material is used as an electronic circuit board, a so-called "base material (support)" corresponds to the reinforcing material. A material for the reinforcing material is not particularly limited, but as the material for the reinforcing material, there are generally given glass, a resin fiber, cellulose, and the like. As more specific examples thereof, there are given glass cloth, woven fabric, non-woven fabric, paper, and the like, and glass cloth is particularly preferred.

The thickness of the reinforcing material (thickness corresponding to one layer of the reinforcing material regardless of whether the reinforcing material is filled into a plurality of layers), which is typically from 1 μm to 500 μm, is preferably 5 μm or more, more preferably 10 μm or more, still more preferably 30 μm or more, most preferably 50 μm or more, and is preferably 400 μm or less, more preferably 300 μm or less, still more preferably 250 μm or less, particularly preferably 200 μm or less, most preferably 150 μm or less.

When the total of the resin and the reinforcing material (total including also the filler when the filler is contained) is 100 parts by mass, the loading amount of the reinforcing material in the composite material, which is typically from 10 parts by mass to 90 parts by mass, is preferably 20 parts by mass or more, preferably 30 parts by mass or more, more preferably 40 parts by mass or more, still more preferably 50 parts by mass or more, particularly preferably 60 parts by mass or more, and is typically 85 parts by mass or less, preferably 80 parts by mass or less, more preferably 78 parts by mass or less, still more preferably 73 parts by mass or less, particularly preferably 70 parts by mass or less. In addition, the content (actual measurement value) of the reinforcing material in the composite material, which is typically from 10 mass % to 90 mass %, is preferably 20 mass % or more, preferably 30 mass % or more, more preferably 40 mass % or more, still more preferably 50 mass % or more, particularly preferably 60 mass % or more, and is typically 85 mass % or less, preferably 80 mass % or less, more preferably 78 mass % or less, still more preferably 73 mass % or less, particularly preferably 70 mass % or less. When the loading amount falls within the above-mentioned ranges, satisfactory properties, such as a specific dielectric constant and a thermal expansion coefficient, as a composite material can be exhibited.

(Application of Composite Material)

The application of the composite material is not particularly limited, but there are given preferably an electronic circuit board, more preferably a circuit board for a mobile phone, a computer, or the like, a substrate of a microstrip patch antenna for millimeter-wave radar, and the like. That is, a substrate containing the above-mentioned composite material (hereinafter sometimes abbreviated as "substrate") is also given as one embodiment of the present disclosure.

The substrate contains the composite material. It is preferred that the substrate include a layer containing a thermoplastic resin bonded to one surface, or each of both surfaces, of the composite material, and a fluororesin is particularly preferred as the thermoplastic resin.

Examples of the fluororesin include polytetrafluoroethylene (PTFE, melting point: 327° C.), a perfluoroalkoxyalkane (PFA, melting point: 310° C.), a tetrafluoroethylene-hexafluoropropylene copolymer (FEP, melting point: 260° C.), polychlorotrifluoroethylene (PCTEF, melting point: 220° C.), a tetrafluoroethylene-ethylene copolymer (ETFE, melting point: 270° C.), a chlorotrifluoroethylene-ethylene copolymer (ECTFE, melting point: 270° C.), and polyvinylidene fluoride (PVDF, melting point: 151° C. to 178° C.). Of those, PTFE and PFA are particularly preferred. Those resins may be used alone or in combination thereof.

The thickness of the resin layer, which is typically from 0.050 μm to 30 μm, is preferably from 0.100 μm or more, more preferably 0.40 μm or more, still more preferably 1.0 μm or more, most preferably 1.5 μm or more, and is preferably 20 μm or less, more preferably 10 μm or less, still more preferably 8.0 μm or less, particularly preferably 6.0 μm or less, most preferably 5.0 μm or less. The substrate is exposed to various chemicals to be used in, for example, a production process for an antenna or the like. For example, when the composite material is exposed to a treatment liquid having high permeability, the treatment liquid may permeate the inside of the substrate to cause an appearance failure or changes in properties thereof. The resin layer also serves to suppress the permeation of the treatment liquid. Accordingly, when the thickness of the resin layer falls within the above-mentioned ranges, peeling of the conductor layer and the like can be effectively suppressed, and the appearance failure or changes in properties are less liable to occur even when the substrate is exposed to the treatment liquid having high permeability and the like to be used in production of an electronic circuit board. The thickness of the resin layer means a numerical value obtained by measuring a distance from an end in the thickness direction of the resin layer to the interface between the composite material and the resin layer at about five to about ten points and averaging the measured distances.

Instead of being laminated on (bonded to) only one surface of the composite material, the resin layer may be laminated on each of both surfaces of the composite material.

A conductor layer is generally formed on the substrate, and the conductor layer is generally a metal layer. When the substrate includes a resin layer, the conductor layer is laminated on the resin layer.

Examples of metallic species of the metal layer generally include gold (Au), silver (Ag), platinum (Pt), copper (Cu), aluminum (Al), and alloys containing these metallic species.

The thickness of the metal layer is typically 5 μm or more, preferably 10 μm or more, more preferably 15 μm or more, and is typically 50 μm or less, preferably 45 μm or less, more preferably 40 μm or less.

A maximum height Rz of a contact surface of the conductor layer with respect to the composite material or the resin layer is typically 0.020 μm or more, preferably 0.050 μm or more, more preferably 0.10 μm or more, still more preferably 0.20 μm or more, particularly preferably 0.30 μm or more, and is typically 10 μm or less, preferably 8.0 μm or less, more preferably 6.0 μm or less, still more preferably 4.0 μm or less, particularly preferably 2.0 μm or less. The "maximum height Rz" means a numerical value determined by a method based on JIS B0601:2013 of Japan Industrial Standards (Japan Industrial Standards created without changing the technical contents of ISO 4287, which is a standard of the International Organization for Standardization). In addition, the "maximum height Rz of the contact surface of the conductor layer with respect to the composite material or the resin layer" may be directly measured, or the maximum height of a material to be used for the conductor layer may be defined as the maximum height Rz.

The thickness obtained by subtracting the maximum height Rz of the conductor layer from the thickness of the resin layer ((thickness of resin layer)−(maximum height Rz of conductor layer)) is typically 0.005 μm or more, preferably 0.010 μm or more, more preferably 0.050 μm or more, still more preferably 0.10 μm or more, particularly preferably 0.50 μm or more, and is typically 29.98 μm or less, preferably 20 μm or less, more preferably 15 μm or less, still more preferably 10 μm or less, particularly preferably 5.0 μm or less. When the thickness falls within the abovementioned ranges, the thickness of the resin layer is sufficiently ensured. Accordingly, the appearance failure or changes in properties are less liable to occur even when the resin layer is exposed to the treatment liquid having high permeability and the like to be used in production of an electronic circuit board.

(Method of Producing Composite Material)

The composite material contains a resin and at least one kind selected from the group consisting of a filler and a reinforcing material, and it is preferred that the composite material contain at least the filler. A method of producing a composite material is not particularly limited, and the composite material may be produced by appropriately adopting a known finding. However, when the resin is a thermoplastic resin, such as a fluororesin, in order to suppress the standard deviation of densities to a low level, a production method focusing on at least one of the following viewpoints (1) to (3) is preferred.

(1) The particle diameter ratio between an average particle diameter of a granulated product of a resin to be prepared and an average particle diameter of a granulated product of a filler to be prepared is controlled.

When the particle diameter ratio between the average particle diameters of the granulated product of the resin and the granulated product of the filler is controlled, the filler can be easily distributed uniformly in the resin serving as a base material.

(2) A physical load is applied when the granulated product of the resin and the granulated product of the filler are mixed with each other.

When a physical load is applied while the granulated product of the resin and the granulated product of the filler are mixed with each other, the particle diameters of the granulated product of the resin and the granulated product of the filler become uniform, and the filler can be easily distributed uniformly in the resin serving as a base material.

(3) A pressure is applied uniformly in plane to the composite material formed into a plate shape.

When a pressure is applied uniformly in plane to the composite material formed into a plate shape, the density, thickness, and the like can be easily made uniform.

Meanwhile, when the resin is a thermosetting resin, such as an epoxy resin, a production method focusing on at least one of the following viewpoints (1') to (4') is preferred.

(1') The average particle diameter of the granulated product of the filler is controlled.

When the average particle diameter of the granulated product of the filler is controlled, the filler can be easily distributed uniformly in the resin serving as a base material.

(2') A physical load is applied when the granulated product of the filler is mixed.

When a physical load is applied while the resin before being thermally cured and the filler are mixed with each other, the particle diameter of the granulated product of the filler becomes uniform, and the filler can be easily distributed uniformly in the resin serving as a base material.

(3') The surface of the filler is modified.

When the surface of the filler is subjected to surface modification with a functional group having a polarity close to that of a base material, aggregation of the filler is prevented, and the filler can be easily dispersed uniformly in the resin serving as the base material.

(4') A pressure is applied uniformly in plane to the composite material formed into a plate shape.

When a pressure is applied uniformly in plane to the composite material formed into a plate shape before being cured, the density, the thickness, and the like can be easily made uniform.

When the reinforcing material is further contained, a production method focusing on at least one of the following viewpoints (1") to (3") is preferred.

(1") The volume ratio between the resin and the reinforcing material in plane is made constant.

When the in-plane distribution of the resin and the reinforcing material in the composite material is made constant, the densities of the reinforcing material and the resin can be easily made uniform. As a specific procedure, there are given using a reinforcing material having a more uniform thickness with less irregularities, stacking a plurality of reinforcing materials to compensate for variation in thickness of the reinforcing material in plane, and the like.

(2") The adhesiveness between the reinforcing material and the resin is improved.

When the adhesiveness between the reinforcing material and the resin is improved, the pores present between the reinforcing material and the resin can be reduced, and the density, the thickness, and the like can be easily made uniform. As a specific procedure, there are given subjecting the surface of the reinforcing material to surface modification close to the polarity of the base material to enhance the wettability of the resin with respect to the reinforcing material, and performing degassing in a production process of the resin and the reinforcing material.

(3") A pressure is applied uniformly in plane to the composite material formed into a plate shape before being thermally cured.

When the resin of the composite material is a thermoplastic resin, a method of producing a composite material including the following resin-preparing step, filler-preparing step, mixing step, forming step, and rolling step (hereinafter sometimes abbreviated as "method of producing a composite material") is preferred:

a resin-preparing step of preparing a thermoplastic resin (hereinafter sometimes abbreviated as "resin-preparing step");

a filler-preparing step of preparing a filler (hereinafter sometimes abbreviated as "filler-preparing step");

a mixing step of mixing the thermoplastic resin, the filler, and a volatile additive to provide a precursor composition (hereinafter sometimes abbreviated as "mixing step");

a forming step of forming the precursor composition to provide a product to be rolled that can be rolled (hereinafter sometimes abbreviated as "forming step"); and a rolling step of rolling the product to be rolled to provide a composite material (hereinafter sometimes abbreviated as "rolling step").

Now, the "resin-preparing step", the "filler-preparing step", the "mixing step", the "forming step", the "rolling step", and the like when the resin of the composite material is a thermoplastic resin are described in detail.

The resin-preparing step is a step of preparing a thermoplastic resin, and the thermoplastic resin may be obtained or produced for oneself. The median diameter d50 of a granulated product of a thermoplastic resin to be prepared (particles after secondary particles) is typically 0.5 μm or more, preferably 1.0 μm or more, more preferably 10 μm or more, still more preferably 30 μm or more, and is typically 700 μm or less, preferably 300 μm or less, more preferably 150 μm or less, still more preferably 100 μm or less, particularly preferably 50 μm or less. When the median diameter d50 falls within the above-mentioned ranges, the resin and the filler can be easily dispersed uniformly, and the standard deviation of densities when the composite material is divided into a plurality of regions can be easily suppressed to a low level. The granulated product of the thermoplastic resin may be determined by a method based on JIS Z8825:2001 of Japan Industrial Standards.

The filler-preparing step is a step of preparing a filler, and the filler (including inorganic fine particle aggregates) may be obtained or produced for oneself. The median diameter d50 of a granulated product of a filler to be prepared (particles after secondary particles) is typically 0.1 μm or more, preferably 0.5 μm or more, more preferably 1 μm or more, still more preferably 3 μm or more, and is typically 500 μm or less, preferably 200 μm or less, more preferably 100 μm or less, still more preferably 50 μm or less, particularly preferably 20 μm or less. When the median diameter d50 falls within the above-mentioned ranges, the resin and the filler can be easily dispersed uniformly, and the standard deviation of densities when the composite material is divided into a plurality of regions can be easily suppressed to a low level. The particle diameter of the granulated product of the filler may be determined by a method based on JIS Z8825:2001 of Japan Industrial Standards.

In addition, it is preferred that the surface of the filler be modified with the above-mentioned surface modifier.

The particle diameter ratio between the average particle diameters of the granulated product of the resin to be prepared and the granulated product of the filler to be prepared (median diameter d50 of the thermoplastic resin/median diameter d50 of the filler) is typically 150 or less, preferably 100 or less, more preferably 60 or less, still more preferably 40 or less, particularly preferably 30 or less, most preferably 10 or less, and is typically 1 or more. When the particle diameter ratio falls within the above-mentioned ranges, the resin and the filler can be easily dispersed uniformly, and the standard deviation of densities when the composite material is divided into a plurality of regions can be easily suppressed to a low level.

The "average particle diameter" as used herein means the particle diameter (median diameter) at an integrated value of 50% in a particle size distribution obtained by a laser diffraction method based on JIS Z8825:2001 of Japan Industrial Standards.

The mixing step is a step of mixing the thermoplastic resin, the filler, and a volatile additive to provide a precursor composition, and the mixing may be performed by appropriately adopting a known method, such as a dry method or a wet method, a mixer, and the like.

The rotation speed (peripheral speed) of a stirrer or the like in the case of the dry method is typically 0.5 m/sec or more, preferably 1 m/sec or more, more preferably 5 m/sec or more, still more preferably 10 m/sec or more, particularly preferably 15 m/sec or more, and is typically 200 m/sec or less, preferably 180 m/sec or less, more preferably 140 m/sec or less, still more preferably 100 m/sec or less, particularly preferably 50 m/sec or less, most preferably 20 m/sec or less. When the rotation speed falls within the above-mentioned ranges, the resin and the filler can be easily dispersed uniformly, and the standard deviation of densities when the composite material is divided into a plurality of regions can be easily suppressed to a low level.

The mixing time in the case of the dry method is typically 10 seconds or more, preferably 20 seconds or more, more preferably 30 seconds or more, still more preferably 40 seconds or more, particularly preferably 1 minute or more, most preferably 5 minutes or more, and is typically 60 minutes or less, preferably 50 minutes or less, more preferably 40 minutes or less, still more preferably 30 minutes or less, particularly preferably 20 minutes or less, most preferably 15 minutes or less. When the mixing time falls within the above-mentioned ranges, the resin and the filler can be easily dispersed uniformly, and the standard deviation of densities when the composite material is divided into a plurality of regions can be easily suppressed to a low level.

The rotation speed (peripheral speed) of a stirrer or the like in the case of the wet method is typically 1 m/sec or more, preferably 5 m/sec or more, more preferably 10 m/sec or more, still more preferably 15 m/sec or more, particularly preferably 20 m/sec or more, most preferably 25 m/sec or more, and is typically 160 m/sec or less, preferably 130 m/sec or less, more preferably 100 m/sec or less, still more preferably 80 m/sec or less, particularly preferably 60 m/sec or less, most preferably 40 m/sec or less. When the rotation speed falls within the above-mentioned ranges, the resin and the filler can be easily dispersed uniformly, and the standard deviation of densities when the composite material is divided into a plurality of regions can be easily suppressed to a low level.

The mixing time in the case of the wet method is typically 5 seconds or more, preferably 10 seconds or more, more preferably 20 seconds or more, still more preferably 30 seconds or more, particularly preferably 40 seconds or more, most preferably 50 seconds or more, and is typically 60 minutes or less, preferably 50 minutes or less, more preferably 40 minutes or less, still more preferably 20 minutes or less, particularly preferably 10 minutes or less, most preferably 5 minutes or less. When the mixing time falls within the above-mentioned ranges, the resin and the filler can be easily dispersed uniformly, and the standard deviation of densities when the composite material is divided into a plurality of regions can be easily suppressed to a low level.

The volatile additive serves to sufficiently incorporate the pores into the composite material by being finally volatilized to be removed. The volatile additive means a compound that has a boiling point of from 30° C. to 300° C. and is a liquid at room temperature (25° C.), and the boiling point of the volatile additive is preferably 50° C. or more, more preferably 100° C. or more, still more preferably 200° C. or more, and is preferably 280° C. or less, more preferably 260° C. or less, still more preferably 240° C. or less.

Examples of the kind of the volatile additive include a hydrocarbon, an ether, an ester, and an alcohol each having low reactivity, and an aliphatic saturated hydrocarbon is preferred. Specific examples thereof include hexane (boiling point: 69° C.), heptane (boiling point: 98° C.), octane (boiling point: 126° C.), nonane (boiling point: 151° C.), decane (boiling point: 174° C.), undecane (boiling point: 196° C.), dodecane (boiling point: 215° C.), tridecane (boiling point: 234° C.), and tetradecane (boiling point: 254° C.), and dodecane is particularly preferred. Those additives may be used alone or in combination thereof.

The addition amount of the volatile additive is typically 1 part by mass or more, preferably 5 parts by mass or more, more preferably 10 parts by mass or more, still more preferably 20 parts by mass or more, particularly preferably 30 parts by mass or more with respect to 100 parts by mass of the total of the resin and the filler, and is typically 200 parts by mass or less, preferably 150 parts by mass or less, more preferably 130 parts by mass or less, still more preferably 110 parts by mass or less, particularly preferably 100 parts by mass or less with respect thereto. When the addition amount falls within the above-mentioned ranges, the composite material can secure a satisfactory porosity.

In the mixing step, in addition to the thermoplastic resin, the filler, and the volatile additive, a solvent is preferably added before the mixing. The solvent has an action of bringing the precursor composition into a paste state to enable its uniform dispersion. Examples of the solvent include water and lower alcohols, such as methanol, ethanol, isopropanol, and butanol. Those solvents may be used alone or in combination thereof.

The forming step is a step of forming the precursor composition to provide a product to be rolled that can be rolled, and a forming machine to be used in the forming step is, for example, an FT die (fishtail extrusion die), a press machine, an extrusion molding machine, or a calender roll. Of those, an FT die is particularly preferred.

The rolling step is a step of rolling the product to be rolled to provide a composite material. The step is preferably "multi-stage rolling" in which the following operation is repeated a plurality of times: the resultant rolled products are laminated, and the laminate is rolled as a product to be rolled. The step is particularly preferably "directionally different multi-stage rolling" in which the product to be rolled is rolled in a direction different from the previous rolling direction. The directionally different multi-stage rolling is, for example, the repetition of the following operation: a product to be rolled is obtained by laminating rolled products so that the rolled products may face the same rolling direction, and the product to be rolled is rolled in a rolling direction rotated from the previous rolling direction by 90°.

The number of the rolled products to be laminated in the multi-stage rolling is typically 2 or more, preferably 3 or more, more preferably 4 or more, still more preferably 10 or more, particularly preferably 30 or more, and is typically 2,000 or less, preferably 1,000 or less, more preferably 700 or less, still more preferably 500 or less, particularly preferably 300 or less.

The rolling ratio in the rolling step is typically 10 or more, preferably 20 or more, more preferably 40 or more, still more preferably 50 or more, particularly preferably 100 or more, and is typically 20,000 or less, preferably 15,000 or less, more preferably 10,000 or less, still more preferably 5,000 or less, particularly preferably 3,000 or less.

An apparatus to be used in the rolling step is, for example, a press machine, an extrusion molding machine, or a rolling roll (e.g., a calender roll).

The method of producing the composite material or the method of producing the substrate may include any other step, and specific examples thereof include the following steps:

- an additive-removing step of removing the volatile additive from the rolled product (hereinafter sometimes abbreviated as "additive-removing step");
- heat-compressing step of subjecting the rolled product to heat compression (hereinafter sometimes abbreviated as "heat-compressing step");
- a resin layer-forming step of forming a resin layer containing a thermoplastic resin on one surface, or each of both surfaces, of the composite material (hereinafter sometimes abbreviated as "resin layer-forming step");
- a conductor layer-forming step of forming a conductor layer on one surface, or each of both surfaces, of the composite material (hereinafter sometimes abbreviated as "conductor layer-forming step"); and
- a patterning step of subjecting the conductor layer to patterning treatment (hereinafter sometimes abbreviated as "patterning step").

Now, the "additive-removing step", the "heat-compressing step", the "resin layer-forming step", the "conductor layer-forming step", the "patterning step", and the like are described in detail.

The additive-removing step is a step of removing the volatile additive from the rolled product, and a method therefor is typically, for example, a method involving heating the rolled product in a heating furnace that may be used in drying. A heating condition may be appropriately selected in accordance with, for example, the boiling point of the volatile additive.

The heat-compressing step is a step of heating and compressing a rolled product, and generally, there is given a method involving heating and compressing through use of a press machine or the like. The heating and compressing conditions may be appropriately selected, but it is preferred to apply a pressure uniformly in plane to the rolled product.

The resin layer-forming step is step of forming a resin containing a thermoplastic resin on one surface, or each of both surfaces, of the composite material. As the formation of the resin layer, there is given a method involving bonding a resin film containing a thermoplastic resin to the composite material by heating and pressurizing the resin film with a press machine or the like. When the resin film containing a thermoplastic resin is heated and pressurized, the thermoplastic resin permeates to the composite material. As a result, peeling of the conductor layer and the like can be effectively suppressed, and a satisfactory specific dielectric constant and the like as a composite material can be secured.

The thickness of the resin film containing a thermoplastic resin is typically 0.050 μm or more, preferably 0.10 μm or more, more preferably 0.40 μm or more, still more preferably 1.0 μm or more, particularly preferably 1.5 μm or more, and is typically 30 μm or less, preferably 20 μm or less, more preferably 10 μm or less, still more preferably 8.0 μm or less, particularly preferably 6.0 μm or less, most preferably 5.0 μm or less.

The pressure in the resin layer-forming step is typically 0.01 MPa or more, preferably 0.10 MPa or more, more preferably 0.50 MPa or more, still more preferably 0.80 MPa or more, particularly preferably 1.00 MPa or more, and is typically 50 MPa or less, preferably 40 MPa or less, more preferably 30 MPa or less, still more preferably 20 MPa or less, particularly preferably 10 MPa or less. When the pressure falls within the above-mentioned ranges, peeling of the conductor layer and the like can be effectively suppressed, and a satisfactory specific dielectric constant and the like as a composite material can be secured.

The temperature in the resin layer-forming step is typically 250° C. or more, preferably 280° C. or more, more preferably 300° C. or more, still more preferably 320° C. or more, particularly preferably 340° C. or more, and is typically 500° C. or less, preferably 480° C. or less, more preferably 460° C. or less, still more preferably 440° C. or less, particularly preferably 420° C. or less. When the temperature falls within the above-mentioned ranges, peeling of the conductor layer and the like can be effectively suppressed, and a satisfactory specific dielectric constant and the like as a composite material can be secured.

The heating and pressurization time in the resin layer-forming step is typically 1 second or more, preferably 30 seconds or more, more preferably 1 minute or more, still more preferably 2 minutes or more, particularly preferably 3 minutes or more, and is typically 180 minutes or less, preferably 120 minutes or less, more preferably 60 minutes or less, still more preferably 30 minutes or less, particularly preferably 20 minutes or less. When the heating and pressurization time falls within the above-mentioned ranges, peeling of the conductor layer and the like can be effectively suppressed, and a satisfactory specific dielectric constant and the like as a composite material can be secured.

As an apparatus to be used in the resin layer-forming step, there are given a press machine, a hot roll laminating machine, a belt press machine, and the like.

The conductor layer-forming step is a step of forming a conductor layer on one surface, or each of both surfaces, of the composite material, and a method of forming the conductor layer is, for example, sputtering, plating, the pressure bonding of a metal foil, or a lamination method.

The patterning step is a step of subjecting the conductor layer to patterning treatment, and a method for the patterning treatment is, for example, an additive method involving using a photoresist or the like, or a subtractive method based on etching.

When the resin of the composite material is a thermosetting resin, a method of producing a composite material including the following filler-preparing step, mixing step, forming step, and curing step (hereinafter sometimes abbreviated as "method of producing a composite material") is preferred:

a filler-preparing step of preparing a filler (hereinafter sometimes abbreviated as "filler-preparing step");

a mixing step of mixing the thermosetting resin, the filler, and a curing accelerator to provide a precursor composition (hereinafter sometimes abbreviated as "mixing step");

a forming step of forming the precursor composition to provide a composite material formed into a plate shape before being cured (hereinafter sometimes abbreviated as "forming step");

a curing step of curing the composite material formed into a plate shape before being cured to provide a composite material (hereinafter sometimes abbreviated as "curing step");

conductor layer-forming step of forming a conductor layer on one surface, or each of both surfaces, of the composite material (hereinafter sometimes abbreviated as "conductor layer-forming step"); and a patterning step of subjecting the conductor layer to patterning treatment (hereinafter sometimes abbreviated as "patterning step").

Now, the "filler-preparing step", the "mixing step", the "forming step", the "curing step", the "conductor layer-forming step", the "patterning step", and the like when the resin of the composite material is a thermosetting resin are described in detail.

The filler-preparing step is a step of preparing a filler, and the filler (including inorganic fine particle aggregates) may be obtained or produced for oneself. The median diameter d50 of a granulated product of a filler to be prepared (particles after secondary particles) is typically 0.1 μm or more, preferably 0.5 μm or more, more preferably 1 μm or more, still more preferably 3 μm or more, and is typically 500 μm or less, preferably 200 μm or less, more preferably 100 μm or less, still more preferably 50 μm or less, particularly preferably 20 μm or less. The particle diameter of the granulated product of a filler may be determined by a method based on JIS Z8825:2001 of Japan Industrial Standards.

In addition, it is preferred that the surface of the filler be modified with the above-mentioned surface modifier.

In the mixing step, it is preferred that the filler be added to the heated thermosetting resin, and the curing accelerator be added after stirring. The heating temperature of the thermosetting resin is typically 40° C. or more, preferably 50° C. or more, more preferably 60° C. or more, still more preferably 70° C. or more, and is typically 120° C. or less, preferably 110° C. or less, more preferably 100° C. or less, still more preferably 95° C. or less, particularly preferably 90° C. or less. In addition, when the filler is added to the thermosetting resin, it is desired to gradually add the filler dropwise while stirring with a stirrer or the like. The rotation speed (peripheral speed) is typically 0.2 m/sec or more, preferably 0.5 m/sec or more, more preferably 1 m/sec or more, still more preferably 1.5 m/sec or more, and is typically 30 m/sec or less, preferably 25 m/sec or less, more preferably 20 m/sec or less, still more preferably 15 m/sec or less, particularly preferably 10 m/sec or less. The stirring time is typically 10 minutes or more, preferably 30 minutes or more, more preferably 45 minutes or more, still more preferably 60 minutes or more, and is typically 240 minutes or less, preferably 210 minutes or less, more preferably 180 minutes or less, still more preferably 150 minutes or less, particularly preferably 120 minutes or less. When the stirring time falls within the above-mentioned ranges, the resin and the filler can be easily dispersed uniformly, and the standard deviation of densities when the composite material is divided into a plurality of regions can be easily suppressed to a low level. When the curing accelerator is gradually added to the above-mentioned mixture of the thermosetting resin and the filler, it is desired to gradually add the curing accelerator dropwise while stirring with a stirrer or the like. The rotation speed (peripheral speed) is typically 0.2 m/sec or more, preferably 0.5 m/sec or more, more preferably 1 m/sec or more, still more preferably 1.5 m/sec or more, and is typically 30 m/sec or less, preferably 25 m/sec or less, more preferably 20 m/sec or less, still more preferably 15 m/sec or less, particularly preferably 10 m/sec or less. The stirring time is typically 5 minutes or more, preferably 10 minutes or more, more preferably 15 minutes or more, still more preferably 20 minutes or more, and is typically 120 minutes or less, preferably 60 minutes or less, more preferably 50 minutes or less, still more preferably 40 minutes or less, particularly preferably 30 minutes or less.

The forming step is a step of forming the precursor composition into a sheet shape on one surface, or each of both surfaces, of a Cu foil, and the forming method is not particularly limited as long as the forming method is a forming procedure capable of obtaining a predetermined thickness and shape. As a general application system, there are given slot die application, gravure application, bar application, and impregnation application. In particular, when a procedure for reducing irregularities of the surface of a formed body, such as a doctor blade, is added to the bar application or the general application system, the standard deviation of densities when the composite material is divided into a plurality of regions can be easily suppressed to a low level.

The curing step is a step of curing the precursor composition formed on one surface, or each of both surfaces, of the Cu foil, and in general, a chemical reaction is accelerated with heat or a UV-ray as described above (in the curing accelerator). Accordingly, the curing procedure and conditions may be selected depending on the kinds of the selected thermosetting resin and curing accelerator. In the UV-curable type, the curing reaction can be accelerated by performing annealing treatment by heating after UV irradiation. In the case of the thermosetting type, curing can be accelerated only by annealing treatment without a UV-irradiating step. In the annealing treatment, in general, the treatment procedure is not particularly limited as long as heat is applied to the precursor composition, but in order to reduce the surface irregularities of the composite, it is preferred to pressurize the surface uniformly in plane through use of heat press.

The conductor layer-forming step is a step of forming a conductor layer on one surface, or each of both surfaces, of the composite material, and a method of forming the conductor layer is, for example, sputtering, plating, the pressure bonding of a metal foil, or a lamination method.

The patterning step is a step of subjecting the conductor layer to patterning treatment, and a method for the patterning treatment is, for example, an additive method involving using a photoresist or the like, or a subtractive method based on etching.

EXAMPLES

The present disclosure is described below more specifically by way of Examples, and appropriate modifications may be made without departing from the spirit of the present disclosure. Accordingly, the scope of the present disclosure should not be construed as being limited by the specific examples described below.

Example 1

Polytetrafluoroethylene (hereinafter sometimes abbreviated as "PTFE") serving as a fluororesin was adopted as a resin, and hydrophobic fumed silica (hereinafter sometimes abbreviated as "fumed silica") was adopted as a filler. As the pretreatment of the resin, PTFE (manufactured by Daikin Industries, Ltd., product number: "Polyflon PTFE F-104", average particle diameter: 768 µm) and a dry ice pellet (1 mm×1 mm×3 mm) were adjusted so as to achieve 1:3 (mass ratio), and the resultant was pulverized with a mechanical continuous pulverizer mill (peripheral speed: 100 m/sec, time: 1 second) to produce PTFE powder having an average particle diameter of 114 µm (average particle diameter is a numerical value determined by a method based on JIS Z8825:2001 of Japan Industrial Standards). Fumed silica (manufactured by Nippon Aerosil Co., Ltd., product number: "NY50", BET specific surface area: 30 $m^2$/g, apparent specific gravity: 60 g/L, average particle diameter of primary particles: 30 nm, average particle diameter of a granulated product: 5 µm) was adjusted so that the ratio between the pretreated PTFE and the fumed silica became 40:60 (mass ratio), and the resultant was mixed with a high-speed flow mixer (peripheral speed: 18 m/sec, time: 10 minutes). Dodecane serving as a volatile additive was added to the mixture in an amount of 40 mass % (with respect to the entire mass), and the resultant was mixed with a paddle type mixer (peripheral speed: 9 m/sec, temperature: 24° C., time: 1 minute). The obtained paste was formed with a fishtail extrusion die to obtain a rectangular base sheet (sheet-like formed body) having a sheet thickness of 2 mm, a width of 40 mm, and an arbitrary length. A plurality of base sheets were produced.

Two of the base sheets were superposed on one another while rolling directions thereof were aligned with each other. The base sheets were rolled in the previous rolling direction while sheet surfaces thereof were kept parallel to each other, to thereby produce a second rolled laminated sheet. A plurality of second rolled laminated sheets were produced. Further, four of the second rolled laminated sheets were superposed on one another to be laminated, to thereby produce a third rolled laminated sheet. Thus, the step of laminating and rolling the sheets was repeated a total of four times counted from the lamination and rolling of the base sheets, and then the resultant was rolled a plurality of times while a gap between the rolling rolls was narrowed by 0.5 mm each time, with the result that a sheet having a thickness of about 160 µm was obtained (number of layers forming the sheet: 128). Next, the volatile additive was removed by heating the resultant rolled laminated sheet at 150° C. for 20 minutes, to thereby produce a composite material of Example 1.

Next, FLUON(trademark) PTFE dispersion AD939E (manufactured by AGC Inc., solid content: 60 mass %, average particle diameter: 39 µm) was applied to one surface of a polyimide carrier by dip coating so that a WET thickness (thickness of a coating film in an undried state) became 4 µm, and the resultant was heated at 150° C. for 5 minutes and at 380° C. for 5 minutes to produce a resin film serving as a resin layer. A Cu foil (manufactured by JX Nippon Mining & Metals Corporation, product number: "BHFX-HS-92F", thickness: 18 µm, maximum height Rz: 0.75 µm) serving as a conductor layer was prepared, and the resin layer film and the Cu foil were laminated and pressurized with a press machine at a pressure of 6 MPa and a temperature of 360° C. for 10 minutes to produce a resin conductor sheet. The resin conductor sheet and the above-mentioned composite material were laminated, and the resultant was subjected to pressure forming at 360° C. for 10 minutes at 6 MPa to obtain a substrate with a copper layer using the composite material of Example 1. The final thickness (substrate (composite material)+(copper layer (conductor layer)) was about 162 µm.

Example 2

FLUON (trademark) PTFE dispersion AD939E (manufactured by AGC Inc., solid content: 60 mass %, average particle diameter: 39 µm) and fumed silica (manufactured by Nippon Aerosil Co., Ltd., product number: "NY50", BET specific surface area: 30 m$^2$/g, apparent specific gravity: 60 g/L, average particle diameter of primary particles: 30 nm, average particle diameter of a granulated product in the liquid: 17 µm) were adjusted so that the ratio between the PTFE and the fumed silica became 40:60 (mass ratio). The resultant was put in a methanol aqueous solution (methanol concentration: 60 mass %) having a mass which was 10 times as large as the mass of the fumed silica, and dispersed with a homogenizer (peripheral speed: 30 m/sec, temperature: 25° C., time: 1 minute). The obtained gel-like PTFE/fumed silica dispersion liquid was dried at 150° C. for 3 hours, and dodecane serving as a volatile additive was added to the obtained powder by the same procedure as that in Example 1, followed by rolling and pressing, to obtain a composite material of Example 2. Next, a resin conductor sheet was laminated by the same procedure as that in Example 1 to obtain a substrate with a copper layer using the composite material of Example 2. The final thickness (substrate (composite material)+copper layer (conductor layer)) was about 169 µm.

Example 3

As the pretreatment of a resin, PTFE (manufactured by Daikin Industries, Ltd., product number: "Polyflon PTFE F-104", average particle diameter: 768 µm) and a dry ice pellet (1 mm×1 mm×3 mm) were adjusted so as to achieve 1:3 (mass ratio), and the resultant was pulverized with a mechanical continuous pulverizer mill (peripheral speed: 100 m/sec, time: 1 second) to produce PTFE powder having an average particle diameter of 249 µm. Fumed silica (manufactured by Nippon Aerosil Co., Ltd., product number: "NY50", BET specific surface area: 30 m$^2$/g, apparent specific gravity: 60 g/L, average particle diameter of primary particles: 30 nm, average particle diameter of a granulated product: 5 µm) was adjusted so that the ratio between the pretreated PTFE and the fumed silica became 40:60 (mass ratio), and the resultant was mixed with a high-speed flow mixer (peripheral speed: 18 m/sec, time: 10 minutes). Dodecane serving as a volatile additive was added to the obtained mixed powder by the same procedure as that in Example 1, followed by rolling and pressing, to obtain a composite material of Example 3. Next, a resin conductor sheet was laminated by the same procedure as that in Example 1 to obtain a substrate with a copper layer using the composite material of Example 3. The final thickness (substrate (composite material)+copper layer (conductor layer)) was about 169 µm.

Example 4

As the pretreatment of a resin, PTFE powder having an average particle diameter of 114 µm was produced by the same procedure as that in Example 1. Fumed silica (manufactured by Nippon Aerosil Co., Ltd., product number: "NY50", BET specific surface area: 30 m$^2$/g, apparent specific gravity: 60 g/L, average particle diameter of primary particles: 30 nm, average particle diameter of a granulated product: 5 µm) and molten silica (manufactured by Denka Company Limited, product number: "SFP-130MC", BET specific surface area: 6 m$^2$/g, apparent specific gravity: 200 g/L, average particle diameter of primary particles: 600 nm, average particle diameter of a granulated product: 10 µm) were adjusted so that the ratio therebetween became 45:55 (mass ratio), and the resultant was mixed with a high-speed flow mixer (peripheral speed: 18 m/sec, time: 1 minute) to produce mixed powder (BET specific surface area: 18 m$^2$/g, apparent specific gravity: 130 g/L, average particle diameter of primary particles: 320 nm, average particle diameter of a granulated product: 8 µm). The mixed powder and the pretreated PTFE powder were adjusted so that the ratio therebetween became 62:38, and the resultant was mixed with the high-speed flow mixer (peripheral speed: 18 m/sec, time: 1 minute). Dodecane serving as a volatile additive was added to the mixture in an amount of 40 mass % (with respect to the entire mass), and the resultant was mixed with a paddle type mixer (peripheral speed: 9 m/sec, temperature: 24° C., time: 1 minute). The obtained paste was formed with a fishtail extrusion die to obtain a rectangular base sheet (sheet-like formed body) having a sheet thickness of 2 mm, a width of 40 mm, and an arbitrary length. A plurality of base sheets were produced. As the later step, a substrate with a copper layer was produced by the same procedure as that in Example 1. The final thickness (substrate (composite material)+copper layer (conductor layer)) was about 163 µm.

Example 5

A liquid epoxy resin (manufactured by Mitsubishi Chemical Corporation, jER828) and fumed silica (manufactured by Nippon Aerosil Co., Ltd., product number: "NY50", BET specific surface area: 30 m$^2$/g, apparent specific gravity: 60 g/L, average particle diameter of primary particles: 30 nm, average particle diameter of a granulated product: 5 µm) were weighed so that the ratio therebetween became 80:20 (mass ratio). The liquid epoxy resin was stirred under a state of being heated to 80° C. with a small disper device (manufactured by PRIMIX Corporation, LABOLUTION, HOMOGENIZING DISPER 2.5, peripheral speed: 1.5 m/sec., time: 90 minutes), and the fumed silica was gradually added. After the addition of the fumed silica, a curing accelerator (manufactured by San-Apro Ltd., CPI-101A) was added so that the ratio between the curing accelerator and the liquid epoxy resin became 2:100 (mass ratio), and the resultant was stirred with the small disper device (manufactured by PRIMIX Corporation, LABOLUTION, HOMOGENIZING DISPER 2.5, peripheral speed: 1.5 m/sec., time: 30 minutes). Application was performed on a Cu foil (manufactured by JX Nippon Mining & Metals Corporation, product number: "BHFX-HS-92F", thickness: 18 µm, maximum height Rz: 0.75 µm) serving as a conductor layer through use of an applicator (manufactured by Imoto Machinery Co., Ltd., simple applicator 3400) so that the gap of the applicator was adjusted to 0.5 mm. The resultant was subjected to UV irradiation with a UV irradiation device (manufactured by HOYA CANDEO OPTRONICS, H-300AH4-V1-NI1, emission wavelength: 365 nm, exposure amount: 1,000 mJ/cm$^2$). After that, annealing treatment was performed by hot press at 140° C. and 0.1 MPa for 60 minutes. NiCr of 5 nm and Cu of 200 nm were formed on a surface on a side opposite to the Cu foil by sputtering, and then a Cu layer of 18 µm was formed by electrolytic plating, to thereby produce a substrate with a copper layer. The final thickness (substrate (composite material)+copper layer (conductor layer)) was about 153 µm.

Comparative Example 1

Polytetrafluoroethylene (manufactured by Daikin Industries, Ltd., product number: "Polyflon PTFE F-104", average particle diameter: 768 µm) serving as a fluororesin and hydrophobic fumed silica (manufactured by Nippon Aerosil Co., Ltd., product number: "NY50", BET specific surface area: 30 m²/g, apparent specific gravity: 60 g/L, average particle diameter of primary particles: 30 nm, average particle diameter of a granulated product: 5 μm) serving as a filler were mixed with a high-speed flow mixer (peripheral speed: 14 m/sec, time: 10 minutes) so that the ratio between the fumed silica and the pulverized PTFE became 60:40 (mass ratio). Dodecane serving as a volatile additive was added to the obtained mixed powder by the same procedure as that in Example 1, followed by rolling and pressing, to obtain a composite material of Comparative Example 1. Next, a resin conductor sheet was laminated by the same procedure as that in Example 1 to obtain a substrate with a copper layer using the composite material of Comparative Example 1. The final thickness (substrate (composite material)+copper layer (conductor layer)) was about 166 μm.

Comparative Example 2

As a composite material of Comparative Example 2, a commercially available circuit board material (manufactured by Rogers Corporation, product number: "RO3003", thickness: 129 μm, thickness of substrate (composite material)+copper layer (conductor layer): 167 μm) was used. It was recognized that, as described in U.S. Pat. No. 5,922,453 A, the composite material of Comparative Example 2 had a configuration containing silica and titania, the content of silica was 53.5 vol %, the content of titania was 2 vol %, and the content of PTFE was 44.5 vol %.

Comparative Example 3

As a composite material of Comparative Example 3, a commercially available circuit board material (manufactured by Panasonic Corporation, product number: "R-1766", thickness: 224 μm, thickness of substrate (composite material)+copper layer (conductor layer): 260 μm) was used. It was recognized that the composite material of Comparative Example 3 had a configuration containing glass cloth and an epoxy resin cured product.

Measurement of Specific Dielectric Constant

A complex dielectric constant was measured in accordance with a cavity resonator perturbation method (procedure based on IEC 62562) with a measurement frequency being set to 10 GHz, and a real part ($\varepsilon_r'$) thereof was taken as a specific dielectric constant. From each sheet (300 mm×480 mm), 15 evaluation samples each having a strip shape (sample size: width of 2 mm×length of 50 mm) were cut out through use of specific dielectric constant measuring devices (manufactured by Agilent Technologies, Inc., model number: "Network Analyzer N5230C" and manufactured by KANTO Electronic Application and Development Inc., model number: "Cavity Resonator 10 GHz"), and each of an average value, a standard deviation, and a variation value [numerical value calculated by substituting a maximum value, a minimum value, and an average value of a specific dielectric constant value group into the expression ((maximum value-minimum value)/average value×100)] of the specific dielectric constants was calculated. The results are shown in Tables 1 and 2.

Measurement of Density

The 15 evaluation samples each having a strip shape (width of 2 mm×length of 50 mm) used in the above-mentioned "Measurement of Specific Dielectric Constant" were each cut out by 20 mm from a distal end on the side inserted into the cavity resonator, and dimensions in width and length directions were measured through use of a projector (manufactured by Mitutoyo Corporation, model number: "PJ-H30", set magnification: 10 times). The end portion of each of the evaluation samples can be easily determined through measurement by a transmission method. The thickness of the evaluation sample was measured through use of a dial gauge (manufactured by Mitutoyo Corporation, 543 series ABS Solar-type Digimatic Indicator ID-SS), and the mass of each of the 15 evaluation samples was measured through use of an electronic balance (manufactured by Shimadzu Corporation, AUW220D, measurement environment temperature: 25° C., minimum display unit: 0.01 mg). Then, the density was calculated by substituting the measured values into the following equation. The results are shown in Tables 1 and 2.

Density [g/cm³]=mass [g] of sample/(surface area [cm²] of sample×thickness [cm])

Thickness of Composite Material

As the thickness of the composite material, the result of the measurement of thickness involving using the dial gauge (manufactured by Mitutoyo Corporation, 543 series ABS Solar-type Digimatic Indicator ID-SS) in the above-mentioned "Measurement of Density" was taken as the thickness of the composite material.

Measurement of Contents of Filler and Reinforcing Material

Each of the evaluation samples evaluated in the above-mentioned "Measurement of Density" was increased in temperature to 900° C. with TG-DTA (manufactured by Bruker Corporation, 2000SA) in a nitrogen atmosphere at a rate of temperature increase of 20° C./min, and the reduction in mass was evaluated. By substituting the reduction in mass as the mass of the resin and the mass of the remaining components as the mass of the filler into the following equation, the content of the filler was calculated. The results are shown in Tables 1 and 2.

Content of filler [mass %]=(mass [g] of remaining components/initial mass [g])×100

The above-mentioned method of measuring the content of a filler may be applied with modifications also to the content of a reinforcing material. The content calculated by the above-mentioned equation when both the filler and the reinforcing material are contained is the content of the filler and the reinforcing material.

Calculation of Porosity

The porosity was calculated by substituting the bulk density of the evaluation sample obtained from the above-mentioned "Measurement of Density," the true density calculated from the content of the filler calculated by the above-mentioned "Measurement of Content of Filler," and the density of air into the following equation. The calculation was performed through use of the density of silica of 2.2 [g/cm³], the density of PTFE of 2.1 [g/cm³], the density of titania of 4.0 [g/cm³], the density of glass cloth of 2.4 [g/cm³], and the density of an epoxy resin of 1.13 [g/cm³]. The results are shown in Tables 1 and 2.

Porosity [vol %]=(bulk density [g/cm³]−true density [g/cm³])/(bulk density [g/cm³]−density of air [g/cm³])×100

True density [g/cm³]=mass % of filler×density of filler [g/cm³]+mass % of resin×density of resin [g/cm³]

Measurement of Thermal Expansion Coefficient in Z-axis

The measurement of the thermal expansion coefficient in a Z-axis direction was evaluated by a laser interference method (manufactured by ULVAC Riko, Inc., laser thermal dilatometer LIX-1 type, measurement temperature range: −50° C. to 200° C., rate of temperature increase: 2° C./min, atmosphere: He, applied load: 17 g). The thermal expansion coefficient was calculated from an equation based on JIS R3251-1990 of Japan Industrial Standards, and an average value of the thermal expansion coefficients from −50° C. to 200° C. was adopted. The results are shown in Tables 1 and 2.

Figure 5:
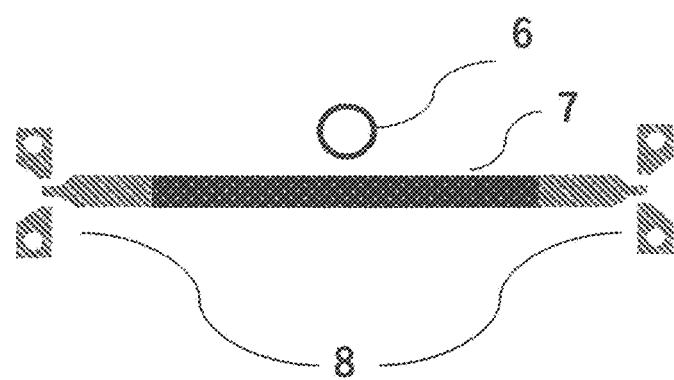
FIG. 5 is a conceptual diagram of a ring resonator pattern formed on a substrate with a copper layer using a composite material of Example 1 and a substrate with a copper layer using a composite material of Comparative Example 2.
Figure 6:
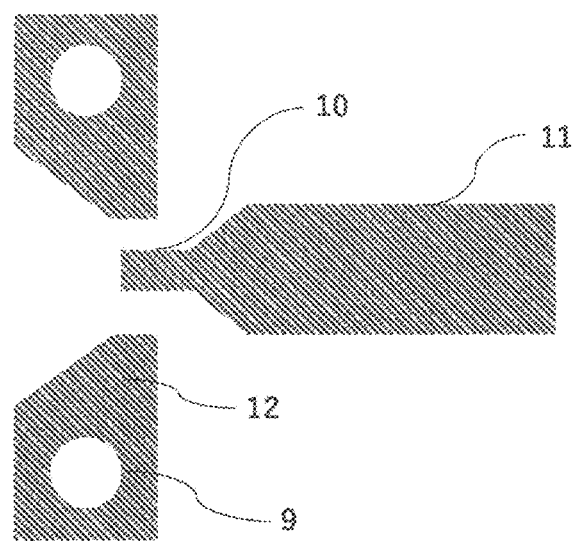
FIG. 6 is a conceptual diagram of a probe contact pattern for connecting a ring resonator pattern and an evaluation probe.

FIG. 5 is a diagram for illustrating a ring resonator pattern, and FIG. 6 is a diagram for illustrating a pattern of a contact portion with respect to a measurement terminal.

Formation of Ring Resonator

A ring resonator pattern was formed by a subtractive method on each of a substrate with a copper layer using the composite material of Example 1 and a substrate with a copper layer using the composite material of Comparative Example 2 (see FIG. 5). Under the condition that the plating thickness was set to 17 μm, 15 ring resonator patterns were evenly formed on a sample (300 mm×480 mm), and a Through-Reflect-Line (TRL) standard was formed in a center portion. As for the accuracy of circuit processing, circuit processing was performed with processing accuracy based on JIS C5014:1994 of Japan Industrial Standards. As for the design value of the ring resonator, the radius of the ring resonator was determined by substituting the specific dielectric constant of the sample, the thickness of the composite material, and the thickness of the metal layer into the following equations so that a resonance frequency peak was obtained at 60 GHz. The radius of the ring resonator refers to the distance from the center point of the ring resonator having a width of 0.2 mm to the center of the line width of the ring resonator. The length of the microstrip line was set to 10 mm, and the width of the microstrip line was determined by performing Time Domain Reflectometry (TDR) measurement at the end of 50Ω by a procedure based on JIS C5402-23-4: 2006 of Japan Industrial Standards. The results are shown in Tables 1 and 2.

Radius [mm] of ring resonator=$3.14 \times 10^8$ [m/sec]/($2\times \pi 60$ [GHz]×√effective dielectric constant)

Effective dielectric constant=(specific dielectric constant+1)/2+((specific dielectric constant−1)/2)× (1/√(1+12×thickness of composite material [mm]/pattern line width [mm]))

Measurement of Resonance Frequency

The resonance frequency was measured by forming 15 ring resonator patterns evenly on a sheet (300 mm×480 mm) and measuring resonance points of all the 15 patterns through use of a network analyzer (manufactured by Keysight Technologies, N5227A PNA Microwave Network Analyzer, frequency: 0 GHz to 67 GHz) and an evaluation probe (manufactured by Cascade Microtech, ACP65-GSG 150, pad pitch: 150 μm). As for the calibration of the contact between the evaluation probe and the evaluation sample, the evaluation probe was calibrated through use of a TRL standard, and the S-parameter measurement ($S_{21}$) of the ring resonator on the sheet was performed. The resonance frequency peak was determined by a procedure based on IPC-TM-650 2.5.5.5. Of the measured resonance frequency peaks, the difference between the maximum value and the minimum value was adopted as a resonance frequency variation. The results are shown in Tables 1 and 2. The "actual measurement values" in Tables 1 and 2 mean the actual resonance frequency variation values determined by the above-mentioned method, and the "theoretical values" in Tables 1 and 2 mean the theoretical values calculated from the relationship between the standard deviation of densities and the resonance frequency variation (actual measurement values) in Example 1 and Comparative Example 2 (plots in Example 1 and Comparative Example 2 are connected with a straight line, and the standard deviation value of the densities is plotted on the straight line to calculate the theoretical value of the resonance frequency variation).

Resonance frequency variation [GHz]=maximum value [GHz] of resonance frequency peak−minimum value of resonance frequency peak [GHz]

TABLE 1

| | | Example 1 | Example 2 | Example 3 | Example 4 | Example 5 |
|---|---|---|---|---|---|---|
| Resin | Kind | PTFE | PTFE | PTFE | PTFE | Epoxy resin |
| | Median diameter d50 of granulated product [μm] | 114 | 39 | 249 | 114 | Liquid |
| Filler | Kind | Hydrophobic fumed silica NY50 | Hydrophobic fumed silica NY50 | Hydrophobic fumed silica NY50 | Mixed powder | Hydrophobic fumed silica NY50 |
| | BET specific surface area [m²/g] | 30 | 30 | 30 | 18 | 30 |
| | Apparent specific gravity [g/L] | 60 | 60 | 60 | 130 | 60 |
| | Median diameter d50 of primary particles [nm] | 30 | 30 | 30 | 320 | 30 |

TABLE 1-continued

|  |  | Example 1 | Example 2 | Example 3 | Example 4 | Example 5 |
|---|---|---|---|---|---|---|
|  | Median diameter d50 of granulated product [μm] | 5 | 17 | 5 | 8 | 5 |
| Particle diameter ratio of granulated products of resin and filler |  | 23 | 2 | 50 | 14 | — |
|  | Mixing system | Dry | Wet | Dry | Dry | Wet |
|  | Resin:filler (loading amount, mass ratio) | 40:60 | 40:60 | 40:60 | 38:62 | 80:20 |
| Porosity of entire composite material [vol %] |  | 47.4 | 47.6 | 43.3 | 30.1 | 5.8 |
| Density | Average value [g/cm$^3$] | 1.134 | 1.130 | 1.222 | 1.538 | 1.288 |
|  | Standard deviation | 0.012 | 0.012 | 0.019 | 0.021 | 0.023 |
|  | Variation* [%] | 3.99 | 3.43 | 5.50 | 4.62 | 5.03 |
| Specific dielectric constant | Average value | 1.86 | 1.77 | 1.88 | 2.14 | 2.87 |
|  | Standard deviation | 0.0064 | 0.0063 | 0.0139 | 0.0131 | 0.0195 |
|  | Variation* [%] | 1.2 | 1.1 | 2.3 | 2.1 | 2.3 |
| Content of filler | Average value [mass %] | 55.33 | 55.74 | 52.08 | 58.81 | 22.20 |
|  | Standard deviation | 0.55 | 0.53 | 0.41 | 0.17 | 0.90 |
|  | Variation* [%] | 2.73 | 2.80 | 2.23 | 0.90 | 10.5 |
| Thickness of composite material | Average value [μm] | 126 | 131 | 131 | 127 | 117 |
|  | Standard deviation | 3 | 2 | 3 | 2 | 8 |
|  | Variation* [%] | 8 | 5 | 9 | 6 | 21 |
| Thermal expansion coefficient in Z-axis direction [ppm/K] |  | 20 | 20 | 21 | 22 | 90 |
| Design value of width of microstrip line [mm] |  | 0.420 | 0.420 | 0.420 | 0.400 | 0.280 |
| Resonance frequency variation (GHz)** | Actual measurement value |  |  |  |  |  |
|  | Theoretical value | — | 0.39 | 0.57 | — |  |

TABLE 2

|  |  | Comparative Example 1 | Comparative Example 2 | Comparative Example 3 |
|---|---|---|---|---|
| Resin | Kind | PTFE | PTFE | Epoxy resin |
|  | Median diameter d50 of granulated product [μm] | 768 | — | — |
| Filler or reinforcing material | Kind | Hydrophobic fumed silica NY50 | Silica titania | Glass cloth |
|  | BET specific surface area [m$^2$/g] | 30 | — | — |
|  | Apparent specific gravity [g/L] | 60 | — | — |
|  | Median diameter d50 of primary particles [nm] | 30 | — | — |
|  | Median diameter d50 of granulated product [μm] | 5 | — | — |
| Particle diameter ratio of granulated products of resin and filler |  | 154 | — | — |
|  | Mixing system | Dry | — | — |
|  | Resin:filler (loading amount, mass ratio) | 40:60 | — | — |
| Porosity of entire composite material [vol %] |  | 41.7 | 9.0 | 16.8 |
| Density | Average value [g/cm$^3$] | 1.254 | 1.971 | 1.570 |
|  | Standard deviation | 0.028 | 0.036 | 0.030 |
|  | Variation* [%] | 6.37 | 7.48 | 5.97 |
| Specific dielectric constant | Average value | 1.91 | 2.75 | 3.30 |
|  | Standard deviation | 0.0256 | 0.0206 | 0.030 |
|  | Variation* [%] | 5.1 | 2.9 | 3.0 |
| Content of filler or reinforcing material | Average value [mass %] | 50.75 | 57.71 | 70.85 |
|  | Standard deviation | 0.72 | 0.37 | 0.20 |
|  | Variation* [%] | 4.06 | 1.91 | 0.85 |
| Thickness of composite material | Average value [μm] | 128 | 129 | 224 |
|  | Standard deviation | 4 | 1 | 4 |
|  | Variation* [%] | 10 | 4 | 6 |
| Thermal expansion coefficient in Z-axis direction [ppm/K] |  | 20 | 17 | 168 |
| Design value of width of microstrip line [mm] |  | 0.420 | 0.290 | 0.250 |

TABLE 2-continued

|  |  | Comparative Example 1 | Comparative Example 2 | Comparative Example 3 |
|---|---|---|---|---|
| Resonance frequency variation (GHz) ** | Actual measurement value | 0.75 | 0.78 | 0.84 |
|  | Theoretical value | 0.92 | — | — |

*Expression ((maximum value-minimum value)/average value × 100)
**Expression (maximum value-minimum value)

As is apparent from the results shown in Tables 1 and 2, it can be recognized that the commercially available circuit board materials in Comparative Example 2 and Comparative Example 3 each have a standard deviation of densities larger than 0.027 and also have a large variation in resonance frequency. In the composite material of Comparative Example 2, although the standard deviation of the contents of the filler exhibits a low value, the standard deviation of the densities tends to be large. The cause for the foregoing is conceived as described below. As compared to silica and PTFE contained in the composite material, the density of titania is significantly high, and hence the uneven distribution of titania is liable to cause unevenness in distribution of the density. In addition, the same also applies to the composite material of Comparative Example 3. The content of the reinforcing material is large, which causes the uneven distribution of pores and the like.

The composite material according to one embodiment of the present disclosure can be utilized as a circuit board for a mobile phone, a computer, or the like, a substrate of a microstrip patch antenna for millimeter-wave radar, and the like.

Although specific modes of the present disclosure have been described in Examples above, Examples are for illustrative purposes only and are not to be construed as limitative. It is intended that various modifications apparent to a person skilled in the art fall within the scope of the present disclosure.

REFERENCE SIGNS LIST 1 microstrip patch antenna
2 substrate
3 antenna element (patch)
4 radio wave
5 one region of substrate
6 ring resonator pattern
7 microstrip line
8 probe contact pattern
9 through hole
10 signal terminal pad
11 microstrip line connection pattern
12 ground terminal pad

The invention claimed is:

1. A plate-shaped composite material, comprising:
a resin; and
at least one kind selected from the group consisting of a filler and a reinforcing material,
wherein the resin is formed from a granulated resin product and a median diameter d50 of a granulated product of the resin is 0.5 μm or more and 700 μm or less,
wherein, when the plate-shaped composite material is divided into a plurality of regions, a standard deviation of densities (unit: g/cm$^3$) of the respective regions is 0.027 or less, which is calculated from a density value group including the densities, and
wherein number of regions in the plurality regions of the plate-shaped composite material is from 4 to 100.

2. The plate-shaped composite material according to claim 1, wherein a variation value of the densities calculated by substituting a maximum value, a minimum value, and an average value of the density value group into the expression ((maximum value−minimum value)/average value×100) is 7.4% or less.

3. The plate-shaped composite material according to claim 1, wherein the plate-shaped composite material has a porosity of from 3 vol % to 90 vol %.

4. The plate-shaped composite material according to claim 1,
wherein the plate-shaped composite material contains the filler, and
wherein a content of the filler is from 10 mass % to 90 mass %.

5. The plate-shaped composite material according to claim 1,
wherein the plate-shaped composite material contains the filler,
wherein a content of the filler is 57 mass % or less, and
wherein, when the plate-shaped composite material is divided into the plurality of regions, a standard deviation of contents (unit: mass %) of the filler in the respective regions is 0.7 or less,
which is calculated from a content value group including the contents.

6. The plate-shaped composite material according to claim 1,
wherein the plate-shaped composite material contains the reinforcing material, and
wherein a content of the reinforcing material is from 10 mass % to 90 mass %.

7. The plate-shaped composite material according to claim 1, wherein, when the plate-shaped composite material is divided into the plurality of regions, a standard deviation of specific dielectric constants of the respective regions is 0.02 or less, which is calculated from a specific dielectric constant value group including the specific dielectric constants.

8. The plate-shaped composite material according to claim 1, wherein the standard deviation of densities is a standard deviation of a density calculated as follows:
taking 15 evaluation samples each having a strip shape (width of 2 mm×length of 50 mm) from the plate-shaped composite material;
cutting out by 20 mm from a distal end of the evaluation samples;
measuring dimensions in width and length directions through use of a projector;
measuring thickness of the evaluation samples through use of a dial gauge;
measuring mass of each of the 15 evaluation samples through use of an electronic balance; and
calculating the density by substituting the measured values into the following equation:

Density [g/cm$^3$]=mass [g] of sample/(surface area [cm$^2$] of sample×thickness [cm]).

* * * * *